United States Patent [19]

Cavlan

[11] 4,422,072

[45] Dec. 20, 1983

[54] FIELD PROGRAMMABLE LOGIC ARRAY CIRCUIT

[75] Inventor: Napoleone Cavlan, Cupertino, Calif.

[73] Assignee: Signetics Corporation, Sunnyvale, Calif.

[21] Appl. No.: 288,576

[22] Filed: Jul. 30, 1981

[51] Int. Cl.³ .............................................. H04Q 9/00
[52] U.S. Cl. .............................. 340/825.87; 307/465; 340/825.83
[58] Field of Search .......... 340/825.83,825.84, 825.87, 340/825.22; 307/465; 364/716

[56] References Cited

U.S. PATENT DOCUMENTS 4,064,493 12/1977 Davis .
4,124,899 11/1978 Birkner et al. .
4,207,556 6/1980 Sugiyama et al. ............. 340/825.84
4,267,463 5/1981 Mayumi .............................. 307/465

OTHER PUBLICATIONS

"Programmable Logic Array Logic Enhancement", Brickman et al., IBM Technical Disclosure Bulletin, vol. 19, No. 2, Jul. 1976 p. 583.
"Array Logic Processing", Elliott et al., IBM Technical Disclosure Bulletin vol. 16, No. 2, Jul. 1973, pp. 586, 587.
E. Hnatek, *A User's Handbook of Semiconductor Memories*, (John Wylie and Sons, ©1977) Chap. 4, "The Read-Only Memory (ROM) and the Programmable Logic Array (PLA) pp. 182-356, pp. 308-335 enclosed.
L. Ewald et al., "Fusible Link Device"*IBM Tech. Discl. Bull.*, vol. 19, No. 8, Jan. 1977, pp. 3089-3090.
J. Radcliffe, "Fusable Diode Array Circuits," *IBM Tech. Discl. Bull.* vol. 21, No. 1, Jun. 1978, pp. 105-108.
Signetics 82S102/103 and 82S100/101 FPLA's described in *Signetics Bipolar & MOS Memory Data Manual*, Signetics Corp., Mar. 1978.
Signetics 82S104/105 FPLA's described by R. Cline in "A Single-Chip Sequential Logic Element"*1978 IEEE Int'l Solid-State Circuits Conf. Dig. of Tech Papers*, 15-17 Feb. 1978, pp. 204-205.
*Bipolar LSI Data Book*, Monolithic Memoriesk Inc., 1978, pp. 6-1-6-32.

*Primary Examiner*—Donald J. Yusko
*Attorney, Agent, or Firm*—Ronald J. Meetin; Robert T. Mayer; Jack Oisher

[57] ABSTRACT

A field-programmable logic array (FPLA) circuit of both the single level logic type containing a programmable AND/NAND gate array and the multiple level logic type containing a programmable OR/NOR gate array responsive to data from a programmable AND/NAND gate array has the programmable capability for enabling certain device pins to switch between functioning as data output pins and data input pins. A sequential logic FPLA circuit containing the basic elements of the multiple level logic device has a plurality of JK flip-flops for on-chip data storage. Selected flip-flops may be directly loaded from pins also operable for supplying output data, may be dynamically converted to function as D-type flip-flops, or may be asynchronously preset/reset to desired logic states. These features are all controllable through on-chip programmable circuitry.

46 Claims, 28 Drawing Figures

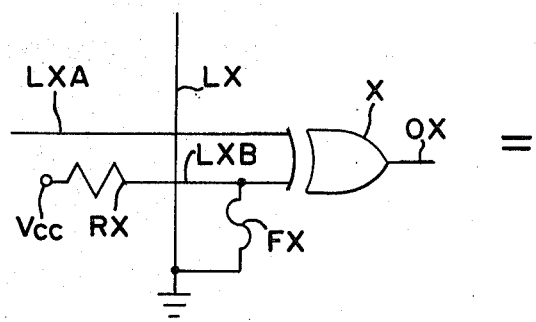
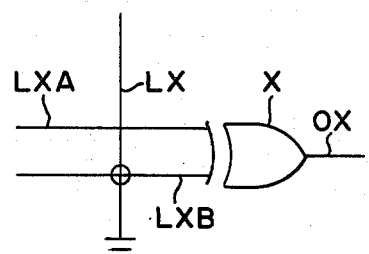
Fig. 7A        Fig. 7B
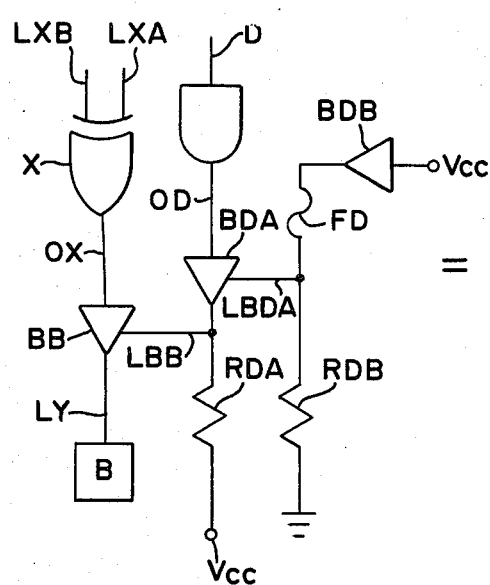
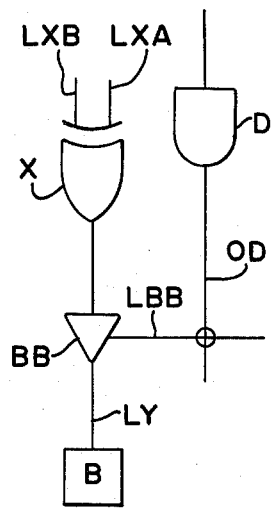
Fig. 8A        Fig. 8B

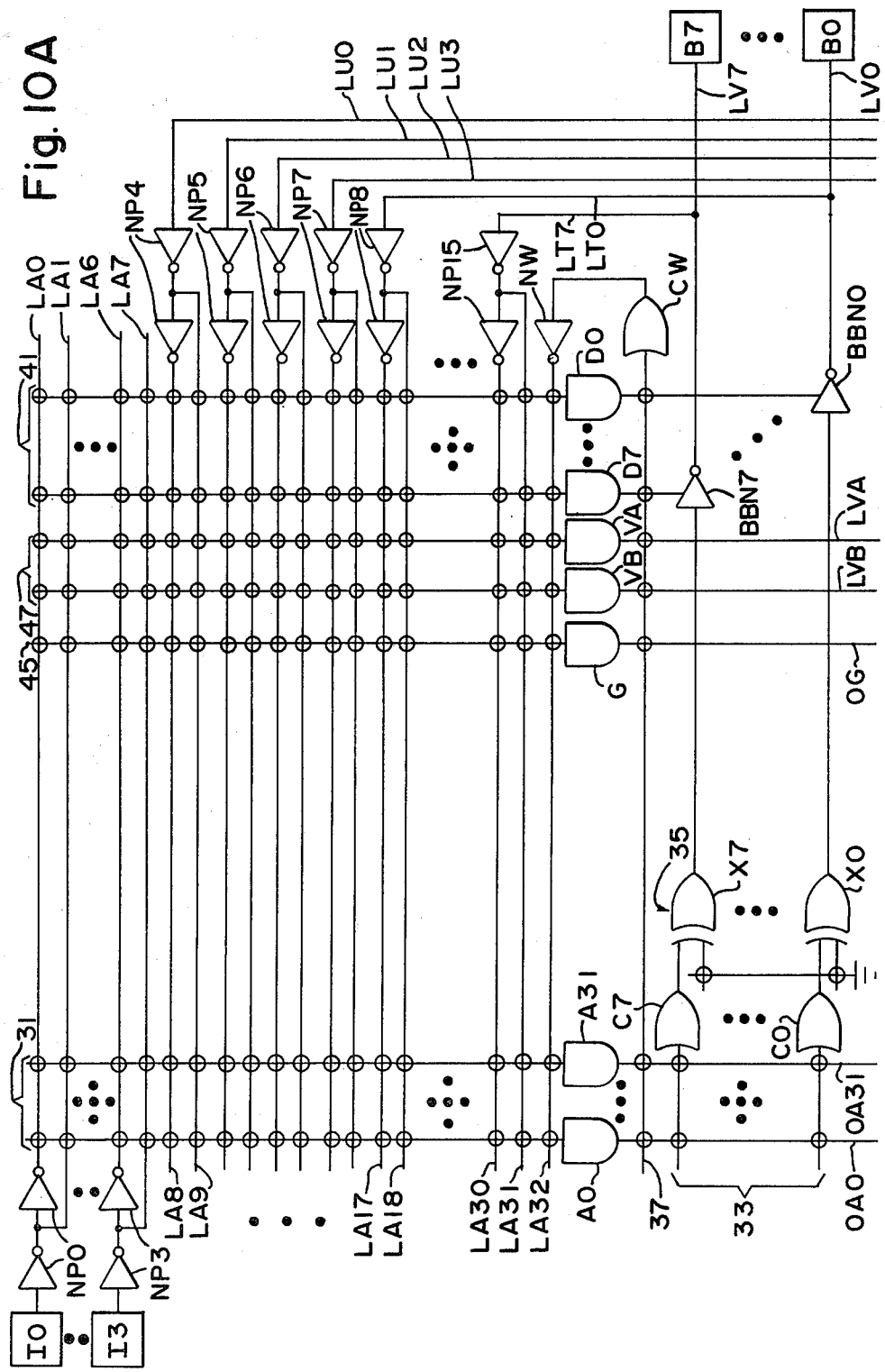

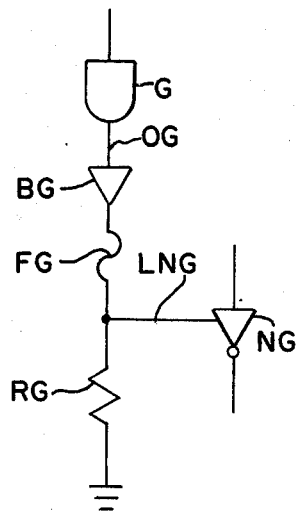
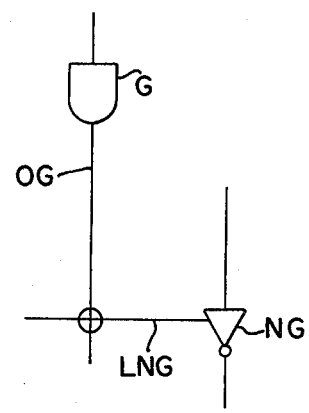
Fig. IIA　　　　　　　　Fig. IIB
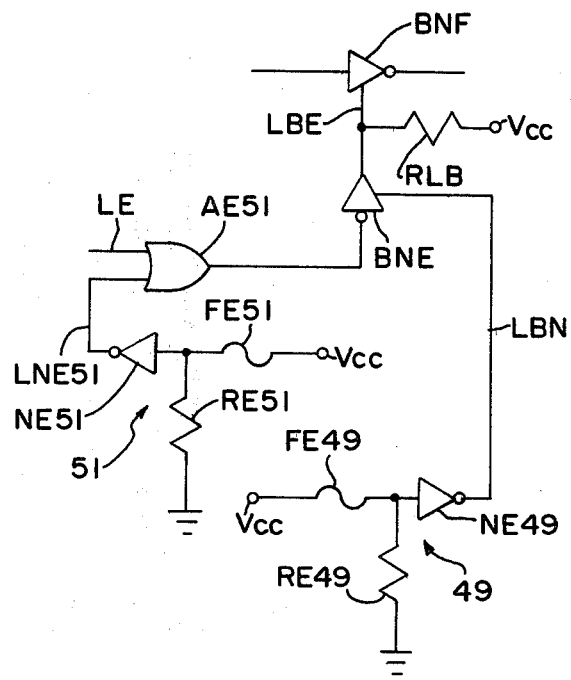
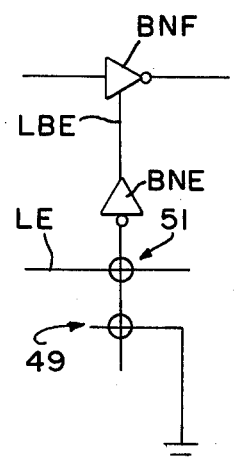
Fig. I2A　　　　　　　　Fig. I2B

FIELD PROGRAMMABLE LOGIC ARRAY CIRCUIT

BACKGROUND OF THE INVENTION

1. Field of the Invention

This invention relates generally to semiconductor digital integrated circuits and more particularly to field-programmable logic array (FPLA) circuits.

2. Description of the Prior Art

Programmable integrated circuits are becoming increasingly popular in the electronics industry since they allow the manufacturer and user great flexibility in tailoring generalized circuits to meet specific applications at relatively low cost. One principal category of programmable integrated circuits is the programmable logic array of which the two basic types are the mask-programmable logic array and the FPLA. In contrast to a mask-programmable logic array which is programmed by the manufacturer from a generalized initial circuit and then distributed to the customers, an FPLA is usually distributed in an unprogrammed state to be programmed by the customer.

An FPLA conventionally employs a set of fusible links located at selected functional cross-points in the circuit. Each link is typically made of a nickel-chromium alloy. The FPLA is programmed to perform a specific function by destroying (or "blowing") a selected pattern of links so as to create open circuits at cross-point locations where no connection is desired, and to leave closed circuits at cross-point locations where the links must remain intact to provide connection.

The standard FPLA consists of a string of logical AND and OR gates arranged in a selected manner. Logical NAND and NOR gates may be utilized in conjunction with, or as substitutes for, the AND and OR gates, respectively.

Turning to the drawings, FIGS. 1A, 1B, and 1C illustrate, respectively, the internal construction of a conventional unprogrammed AND gate A suitable for an FPLA, the representation of gate A in standard notation, and the representation of gate A in a simplified notation. Referring to FIG. 1A, digital input data is provided from N lines LA1, LA2, ... LAN to N corresponding input sections of AND gate A. More particularly, each input section comprises a Schottky diode DAJ (where J is an integer varying from one to N) connected to corresponding line LAJ. Output data from gate A is supplied from its output section on an output line OA powered by a voltage source $V_{CC}$. Line OA in the output section connects to diode DAJ of each input section through a corresponding fusible link FAJ.

Utilization of AND gate A is straightforward. Before any of links FA1-FAN are blown, gate A is responsive to data on all N lines LA1-LAN. Gate A is programmed by destroying selected links FAJ to create open circuits between corresponding diodes DAJ and output line OA. This disconnects the input sections containing those diodes DAJ from the output section so that gate A is no longer responsive to data on those lines LAJ connecting to the disconnected diodes DAJ.

The representation of AND gate A in standard notation as in FIG. 1B is somewhat unsuitable to FPLA circuitry. This is alleviated by the simplified notation of FIG. 1C in which output line OA crosses each line LAJ perpendicularly. Each such intersection represents the unprogrammed coupling of line OA to line LAJ by way of fusible link FAJ and diode DAJ in the manner shown in FIG. 1A. To distinguish intersections representing connections made through unprogrammed fusible links FAJ from other intersections not intended to represent connections in FPLA circuitry, each intersection denoting a connection through fuse FAJ is marked with a small circle. After programming (not shown here), each intersection at which a link FAJ remains intact is indicated by a nodal dot while each intersection at which a link FAJ has been destroyed is indicated as an open circuit by the absence of further labeling. The AND gate symbol is placed at a suitable location along line OA to indicate the function of the illustrated circuitry.

FIGS. 2A, 2B and 2C show, respectively, the internal circuitry of a conventional unprogrammed OR gate C suitable for an FPLA, the representation of gate C in standard notation, and the representation of gate C in the simplified notation described above. Referring to FIG. 2A, N lines LC1, LC2, ... LCN apply digital data to N corresponding input sections of OR gate C. Each input section comprises an NPN bipolar transistor QCJ having its base connected to corresponding line LCJ. Output data is provided on an output line OC in the output section of gate C. Line OC connects to the emitter of transistor QCJ in each corresponding input section through a fusible link FCJ.

OR gate C is utilized in the same manner as AND gate A. Before any of fuses FCJ are blown, OR gate C responds to data on all N lines LC1-LCN. After programming gate C by destroying selected links FCJ, the input sections previously connected to output line OC by these links FCJ are now disconnected from it, and gate C responds only to data on those ones of lines LC1-LCN coupled to the intact ones of fuses FC1-FCN.

As with AND gate A, the simplified notation of FIG. 2C for OR gate C is more appropriate to FPLA circuitry than the standard notation shown in FIG. 2B. The same format is followed in FIG. 2C as in FIG. 1C except that each circled intersection between line OC and a line LCJ for gate C in its unprogrammed state represents the coupling of line OC to line LCJ by way of fusible link FCJ and the emitter and base of transistor QCJ in the manner shown in FIG. 2A.

The general approach followed in FPLA design is to form products through AND gates and then form sums of the products through OR gates. Generally, each product is the product of selected opposite polarities of the data supplied to the AND gates. In some situations it is desirable to operate with NAND gates instead of AND gates or with NOR gates instead of OR gates. One conventional way to achieve this is to simply invert the output of each AND or OR gate.

The FPLA devices designated by product numbers 82S102/82S103, 82S100/82S101, and 82S104/82S105 and made by Signetics Corporation, Sunnyvale, Calif., follow the foregoing approach in their logic structure. The Signetics 82S102/103 and 82S100/101 are described in *Signetics Bipolar & MOS Memory Data Manual,* Signetics Corp., March 1978, pp. 146-155 and 163-166. The circuitry for the Signetics 82S104/105 is described by R. Cline in "A Single-Chip Sequential Logic Element," 1978 *IEEE Int'l Solid-State Circuits Conference Digest of Technical Papers,* 15-17 February 1978, pp 204-5. FIGS. 3-5 illustrate the unprogrammed FPLA circuitries for these devices using the simplified notation described above, but with all nodal dots omitted for clarity.

The Signetics 82S102/103 which is shown in FIG. 3 transmits input data received at 16 fixed input terminals I0-I15 to 16 inverter pairs NP0-NP15 which supply the true input data and its complement on 32 lines LA0–LA31. For example, the true data from pin I0 is provided to line LA0 from the leading inverter of inverter pair NP0 while the complement of the true data is provided to line LA1 from the trailing inverter of pair NP0. The data on lines LA0-LA31 is NANDed by a programmable logic array 20 of nine NAND gates AN0-AN8 each configured as in FIG. 1A, with a suitable inverter. The data from NAND array 20 is supplied to the first input elements in array 22 consisting of nine exclusive OR gates X0-X8 whose second input elements are each connected to ground through corresponding fusible links. Exclusive OR array 22 provides a capability to selectively invert the polarity of the data from NAND array 20. The output data from gates X0-X8 is transmitted through nine controllable output buffers BB0-BB8 to nine fixed output terminals B0-B8. Output buffers BB0-BB8 are enabled or disabled as a group through a common control line LE.

The Signetics 82S100/101 which is shown in FIG. 4 receives input data at fixed input pins I0-I15. As in the Signetics 82S102/103, the true input data and its complement are provided on lines LA0-LA31 from inverter pairs NP0-NP15. The data on lines LA0-LA31 is ANDed by a programmable logic array 30 of 48 AND gates A0-A47 each configured as in FIG. 1A. The data from AND array 30 is then ORed by a programmable logic array 32 of eight OR gates C0-C7 each configured as in FIG. 2A.

The data from OR array 32 is coupled to an array 34 of eight exclusive OR gates X0-X7 (configured in the same way as exclusive OR array 22 of the Signetics 82S102/103) to selectively generate either the true data from gates C0-C7 or its complement, depending on how the fusible links for grounding the second input elements of gates X0-X7 are programmed. Likewise eight output buffers BB0-BB7 on eight lines LY0-LY7 are controlled in the same manner as in the Signetics 82S102/103 to permit or inhibit the transmission of output data from gates X0-X7 to eight fixed output terminals B0-B7.

The Signetics 82S104/105 which is shown in FIG. 5 likewise transmits the true input data received at fixed input pins I0-I15 and its complement to lines LA0–LA31 by way of inverter pairs NP0-NP15. In addition, internal data is provided on 13 lines LA32-LA44. The data on lines LA0-LA44 is ANDed by programmable logic array 30 of AND gates A0-A47 each configured as in FIG. 1A. A programmable NOR loop 36, consisting of an OR gate CW configured as in FIG. 2A and in series with an inverter NW, feeds logic data complementary to that provided from AND gates A0-A47 back into them along line LA44. The data from AND array 30 is also ORed by a programmable logic array 38 of 28 OR gates H0-H27 each configured as in FIG. 2A.

The data from OR array 38 is provided to the S and R synchronous data input terminals of 14 RS flip-flops RS0-RS13 to provide a capability for on-chip data storage. Flip-flops RS0-RS13 can all be asynchronously preset as a group to a logical "1" state through a common control line LPE. The preset capability can be permanently disabled by blowing a suitable fusible link. Output data from the Q output terminals of flip-flops RS0-RS7 is provided on eight lines LZ0-LZ7 to eight fixed output terminals F0-F7 through eight controllable output buffers BF0-BF7. Buffers BF0-BF7 can all be permanently enabled by leaving the aforementioned fusible link intact. If this fuse is blown, buffers BF0-BF7 can be controlled through line LPE to permit or inhibit data transmission to pins F0-F7. Data from the Q output terminals of flip-flops RS8-RS13 is fed back on lines LU0-LU5 to AND array 30. In particular, the true data and its complement are provided through six inverter pairs NP16-NP21 to lines LA32-LA43.

The foregoing Signetics devices were among the first FPLA's in the semiconductor industry. However, they lack certain capabilities that will be advantageous in some future operations. For example, only the Signetics 82S104/105 has any internal feedback capability and that is somewhat limited. The output pins in all of these devices are fixed. None of the output pins can be temporarily or permanently employed for receiving circuit input data so as to provide greater input/output flexibility in some applications.

J. M. Birkner et al. in U.S. Pat. No. 4,124,899, "Programmable Array Logic Circuit" disclose various FPLA devices generally made by Monolithic Memories, Inc., Sunnyvale, Calif., and generally described further in *Bipolar LSI Data Book*, Monolithic Memories, Inc., 1978, pp 6-1-6-32. Birkner et al. disclose a few of the features not available in the foregoing Signetics devices. For example, Birkner et al. disclose feedback from non-programmable OR gates into a programmable AND array. Birkner et al. also disclose circuit terminals controlled by on-chip programmable control logic as either input pins or output pins.

However, Birkner et al. disclose no device comparable to the Signetics 82S102/103. None of the devices disclosed by Birkner et al. utilizes a field programmable OR array. Although Birkner et al. do disclose flip-flops for storing data supplied from OR gates, these flip-flops are D-type only and therefore of limited capability. None of the flip-flops have a preset or a reset capability. The capability to feed output data from the flip-flops back into them can only occur through an internally gated path and, consequently, it is not possible to load the flip-flops directly via any of the controllable input/output pins.

SUMMARY OF THE INVENTION

In accordance with the invention, a single level logic FPLA circuit contains: a plurality of first lines partly consisting of circuit input lines and partly consisting of feedback lines; a plurality of logic AND/NAND gates, each having an output section and a plurality of input sections each connected to a different one of the first lines; logic programmable circuitry for selectively connecting each input section of each logic gate to its output section; a plurality of second lines corresponding to the logic gates and respectively coupled to their output sections for transmitting output data; and feedback circuitry for supplying output data from the second lines to the feedback lines.

The transmission of output data on the second lines can be selectively inhibited by a plurality of buffers corresponding to at least part of the logic AND/NAND gates and respectively coupled between their output sections and the second lines. The activation of each buffer is controlled by a programmable control AND/NAND gate. Suitable programming of the control gate enables a terminal connected to any particular second line downstream of its buffer to dynamically switch between functioning as a circuit output pin and as a circuit input pin by way of the feedback circuitry. This feature provides the customer with the previously unavailable flexibility to tailor the single level logic circuit to meet variable data input/output requirements and thus reduces the total number of FPLA circuits needed in many applications.

The single level logic circuit preferably further includes programmable circuitry for selectively and permanently separating each buffer control line from the output section of its associated control gate. A terminal connected to any particular second line whose buffer has its buffer control line so separated thereby functions unconditionally as a circuit output pin.

The single level logic device may be used for random gating functions, address decoding, code detectors, memory mapped input/output, fault monitors, and input/output port decoders.

In further accordance with the invention, a multiple level logic FPLA circuit contains: a plurality of first lines partly consisting of circuit input lines and partly consisting of feedback lines; a plurality of logic AND/NAND gates, each having an output section and a plurality of input sections each connected to a different one of the first lines; logic programmable circuitry for selectively connecting each input section of each logic AND/NAND gate to its output section; a plurality of logic OR/NOR gates, each having an output section and a plurality of input sections each coupled to a different output section of the logic AND/NAND gates; logic programmable circuitry for selectively connecting each input section of each logic OR/NOR gate to its output sections; a plurality of second lines corresponding to the logic OR/NOR gates and respectively coupled to their output sections for transmitting output data; and feedback circuitry for supplying output data from the second lines to the feedback lines.

The transmission of output data on the second lines can be selectively inhibited by a plurality of buffers corresponding to at least part of the logic OR/NOR gates and respectively coupled between their output sections and the second lines. The activation of each buffer is controlled by a programmable control AND/NAND gate. Suitable programming of the control gate enables a terminal connected to any particular second line downstream of its buffer to dynamically switch between functioning as a circuit output pin and as a circuit input pin by way of the feedback circuitry. This feature allows the customer to tailor the multiple level logic circuit to meet variable data input/output requirements without sacrificing the advantage of having a programmable OR/NOR array, and thus reduces the total number of FPLA circuits needed in many applications.

The multiple level logic device may be used for random logic, code converters, fault detectors, function generators, address mapping, and multiplexing.

In still further accordance with the invention, a sequential logic FPLA circuit contains: a plurality of first lines partly consisting of circuit input lines; a plurality of logic AND/NAND gates, each having an output section and a plurality of input sections each connected to a different first line; logic programmable circuitry for selectively connecting each input section of each logic AND/NAND gate to its output section; a plurality of pairs of logic OR/NOR gates, each having an output section and a plurality of input sections each coupled to a different output section of the logic AND/NAND gates; a plurality of JK flip-flops corresponding to the pairs of logic OR/NOR gates, each flip-flop having a J data input terminal and a K data input terminal coupled respectively to the output sections of the corresponding pair, a clock input terminal for receiving a clock signal, and a data output terminal; and a plurality of second lines corresponding to the flip-flops and respectively coupled to their output terminals for transmitting output data. Preferably, logic programmable circuitry is employed for selectively connecting each input section of each logic OR/NOR gate to its output section.

At least part of the flip-flops are dynamically selectively convertible to D flip-flops. Each of the convertible flip-flops is so converted with an inverter coupled between the input terminals of that flip-flop. The activation of each inverter is controlled by a programmable control AND/NAND gate. Preferably, the sequential logic circuit includes programmable circuitry for selectively and permanently separating electrically the control line of each inverter from the output section of its control gate. This causes the corresponding flip-flop to function unconditionally as a JK flip-flop.

At least part of the JK flip-flops have preset and reset terminals for receiving control data to asynchronously force those flip-flops to logic "0" or logic "1" states. The preset terminal of each of these flip-flops is controlled by a programmable control gate. Each reset terminal is similarly controlled. The use of JK flip-flops especially in conjunction with the asynchronous preset/capability provides the customer with the means to perform substantially more advanced operations than possible in the prior art. One example is a presettable up/down counter.

Output data from at least part of the flip-flops is fed back to those flip-flops through a plurality of feedback gates. The activation of each feedback gate is controlled by a programmable control AND/NAND gate.

The transmission of output data on the second lines is selectively inhibited by a plurality of buffers corresponding to at least part of the flip-flops and respectively coupled between their output terminals and the feedback gates along the corresponding second lines. Each buffer has a buffer control line for receiving enable/disable data and is controlled by such data transmitted on an enable/disable line. Programmable circuitry is employed to selectively couple each buffer control line to the enable/disable line and to a logical "0" source. When the buffer control line for a particular buffer is coupled to the logical "0" source, a terminal connected to the associated second line serves unconditionally as a circuit output terminal. When that buffer control line is coupled to the enable/disable line but is not coupled to the logical "0" source, the circuit terminal can dynamically switch between functioning as an output terminal and as an input terminal by way of the feedback gates for forcing input data into the particular flip-flop. When the buffer control line is not coupled to either the logical "0" source or the enable/disable line, the circuit terminal serves unconditionally as a data input terminal for the particular associated flip-flop. The capability to selectively close the buffers and open the feedback gates frees other pins and permits the logic AND/NAND gates that would otherwise be needed for loading the flip-flops to be used for other operations. Output data from at least part of the flip-flops may also be fed back directly to the programmable AND/NAND logic circuitry.

The sequential logic circuit preferably includes: a plurality of further logic OR/NOR gates, each having an output section and a plurality of input sections each coupled to a different output section of the logic AND/NAND gates; logic programmable circuitry for selectively connecting each input section of each further logic gate to its output section; and a plurality of further section lines corresponding to the further logic OR/NOR gates and respectively coupled to their output sections for transmitting output data. As in the multiple logic device, this output data may be fed back to the programmable AND/NAND logic circuitry. Likewise, the transmission of this output data may be selectively inhibited so that terminals connected to the further second lines may be dynamically switched between functioning as circuit output terminals and as circuit input terminals by using appropriate control programmable AND/NAND gates.

Complementary logic data to that provided from the logic and control AND/NAND gates may be fed back to them by a programmable NOR gate. This saves on input/output pins, minimizes AND/NAND gate usage, and reduces cycle time.

The logic sequencer may also be used for random sequential logic, shift registers, bidirectional data buffers, timing function generators, system controllers, and priority encoders/registers.

In addition, each of the FPLA circits disclosed herein preferably includes programmable circuitry for selectively inverting the polarity of output data from the logic gates. This permits the customer to have both active-high and active-low outputs in the same FPLA circuit.

BRIEF DESCRIPTION OF THE DRAWINGS

FIGS. 7A and 7B show, respectively, a circuit diagram for a fusible link connected to an exclusive OR gate and the representation of that fusible link is simplified FPLA notation.

FIGS. 8A and 8B show, respectively, a circuit diagram for a fusible link coupled between an AND gate and the control input line of a buffer and the representation of that fusible link in simplified FPLA notation.

FIGS. 10A, 10B, and 10C together are a circuit diagram of a first preferred embodiment of a sequential logic FPLA circuit according to the invention.

FIGS. 11A and 11B show, respectively, a circuit diagram for a fusible link coupled between an AND gate and a control input line of an inverter and the representation of that fusible link in simplified FPLA notation.

FIGS. 12A and 12B show, respectively, a circuit diagram for a pair of fusible links along a buffer control line and their representation in simplified FPLA notation.

Like reference symbols are employed in the drawings and in the description of the preferred embodiments to represent the same or very similar items.

DESCRIPTION OF THE PREFERRED EMBODIMENTS

Figure 1A:
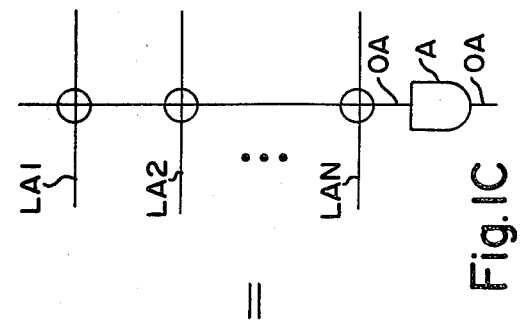
FIGS. 1A, 1B, and 1C show, respectively, a circuit diagram for a conventional AND gate, its standard representation, and its representation in a simplified FPLA notation.
Figure 1B:
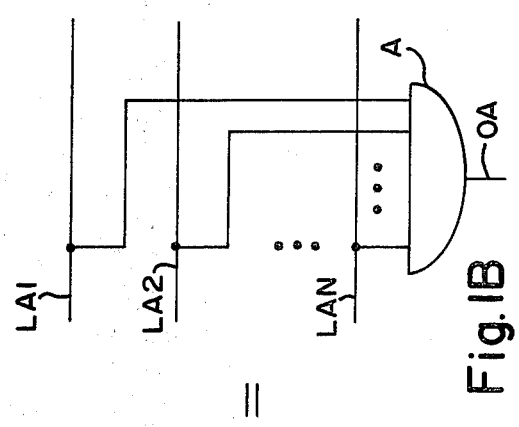
Figure 1C:
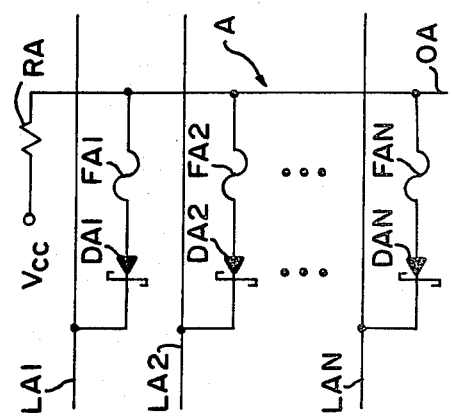
Figure 6A:
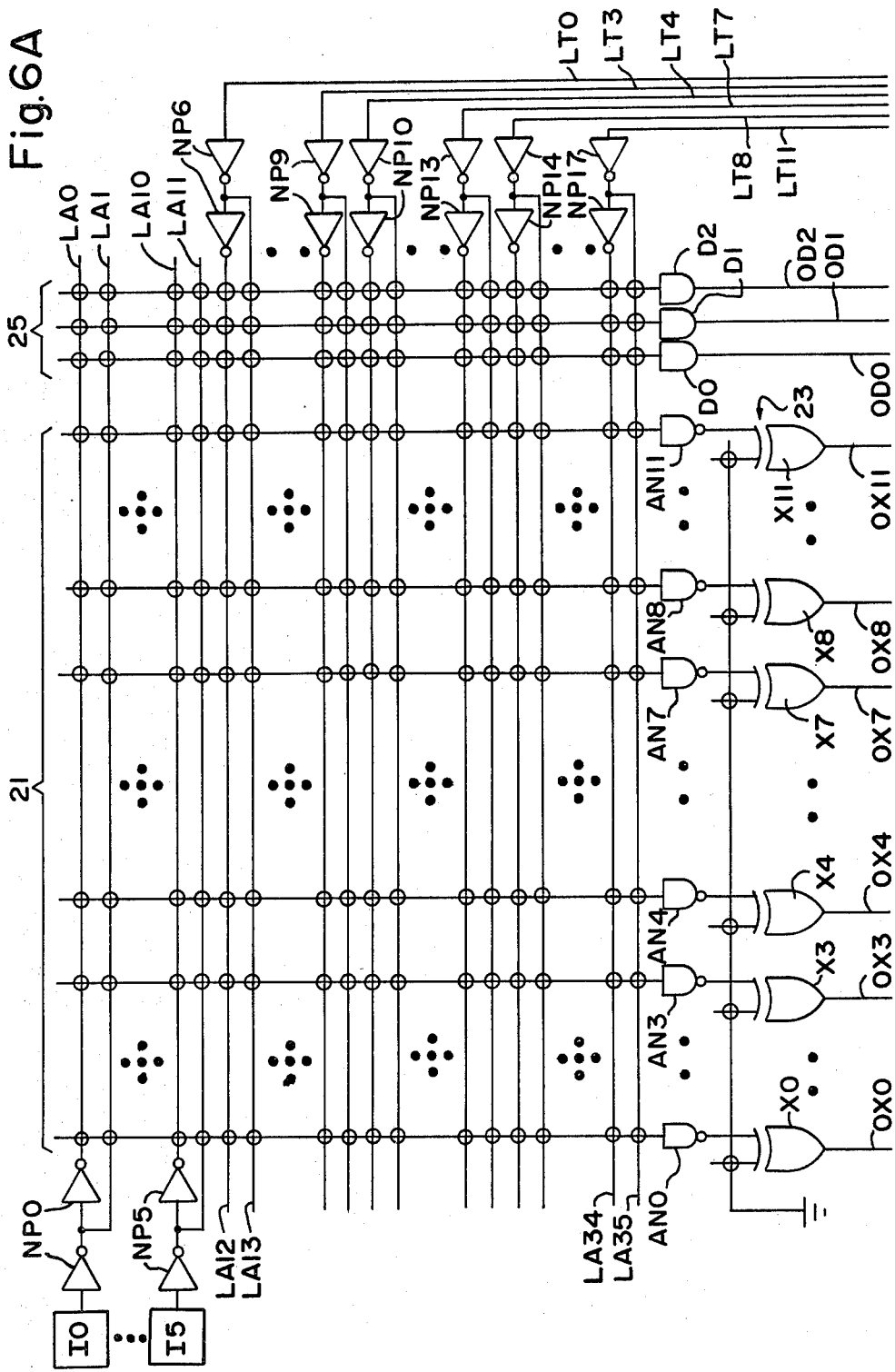
FIGS. 6A and 6B together are a circuit diagram for a single level logic FPLA circuit according to the invention.
Figure 6B:
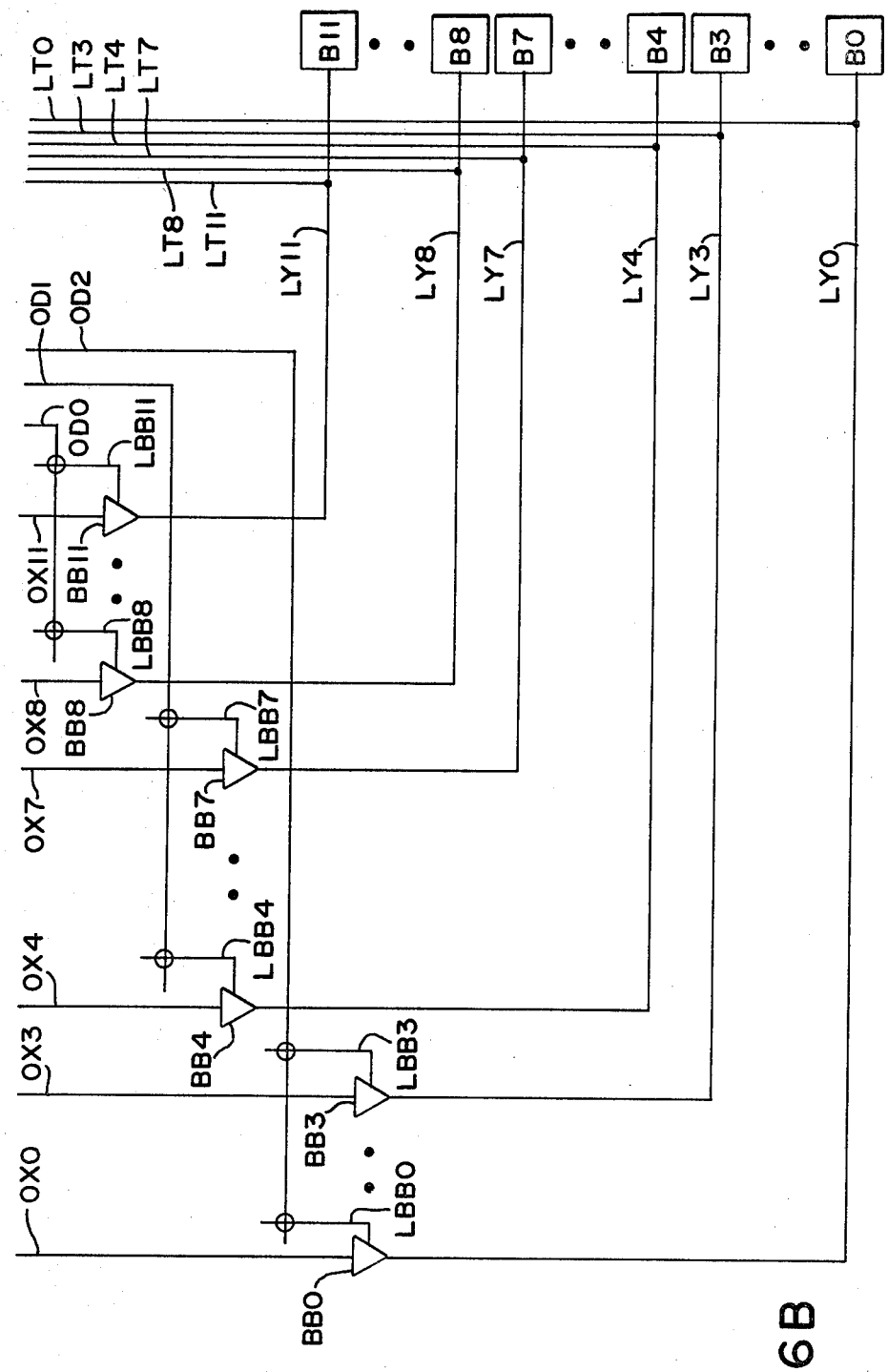

Referring to the drawings, FIG. 6 shows a single level logic FPLA integrated circuit in its unprogrammed state. This circuit receives input data or six fixed input terminals I0–I5 and supplies the true input data and its complement by way of six inverter pairs NP0–NP5, respectively, to 12 lines LA0–LA11 in the manner described previously for the Signetics 82S102/103. In addition, data is provided on 24 lines LA12–LA35. The data on lines LA0–LA35 is NANDed by programmable logic array 21 of 12 NAND gates AN0–AN11 each having 36 input sections and configured as shown in FIG. 1A with an inverter in its output section.

Figure 2A:
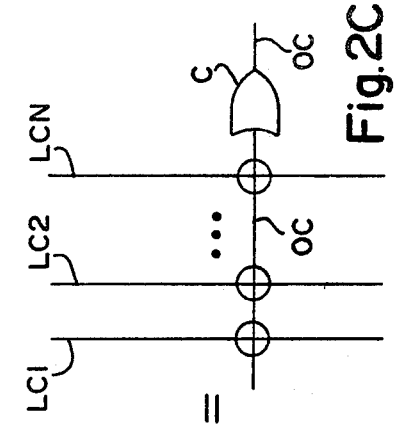
FIGS. 2A, 2B, and 2C show, respectively, a circuit diagram for a conventional OR gate, its standard representation and its representation in the simplified FPLA notation.
Figure 2B:
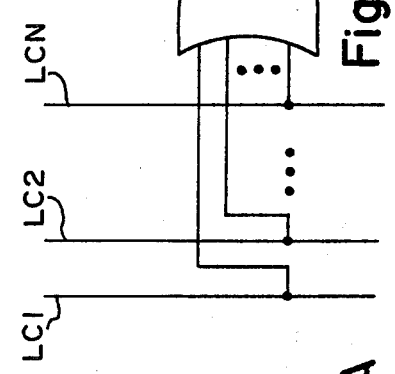
Figure 2C:
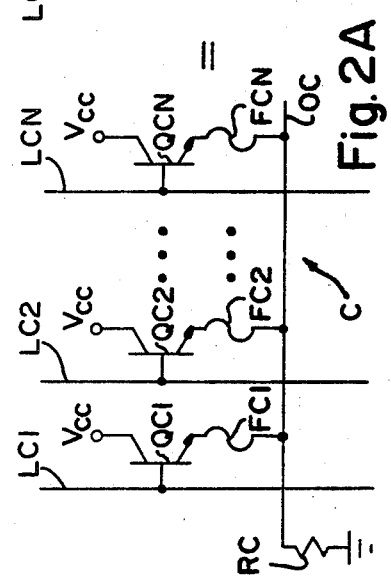
Figure 3:
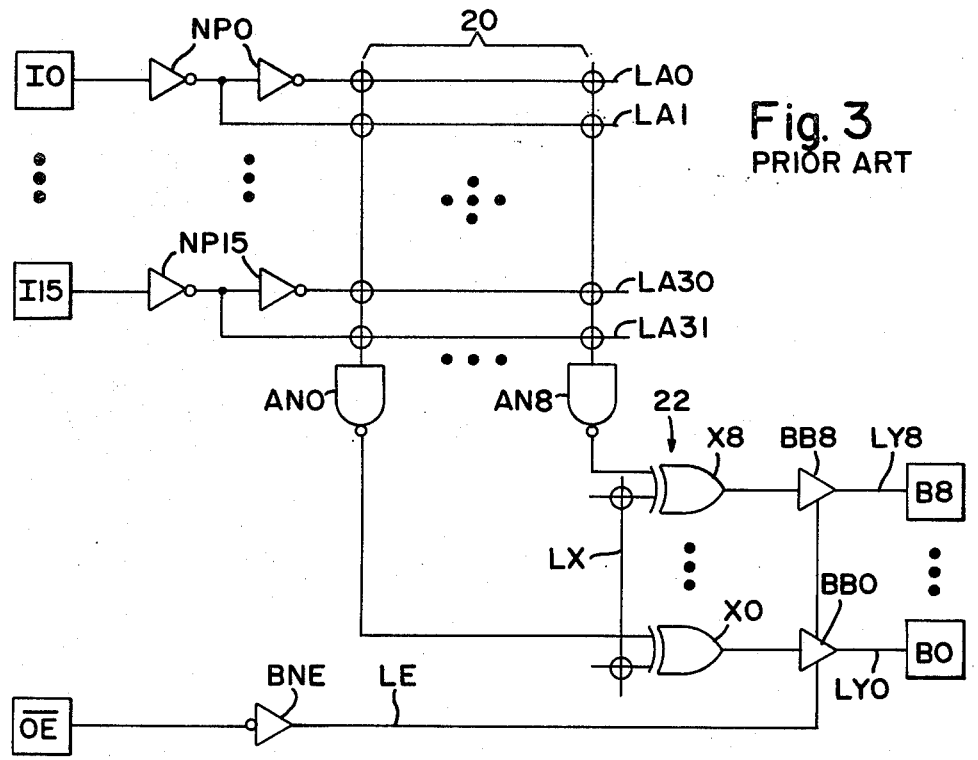
FIGS. 3, 4, and 5 are circuit diagrams for three prior art FPLA circuits.
Figure 4:
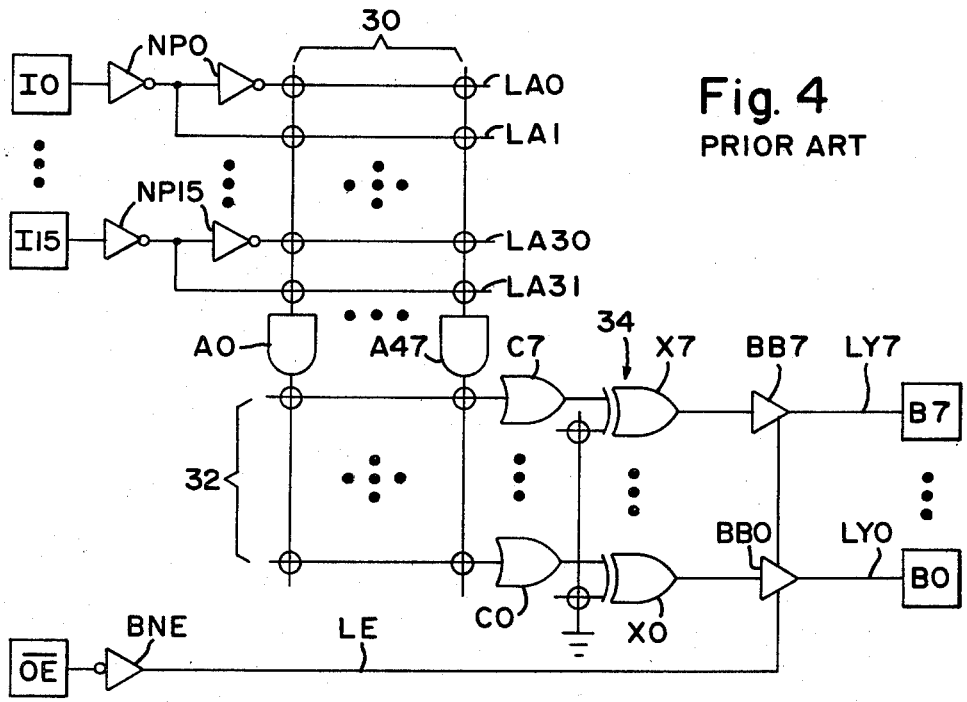
Figure 5:
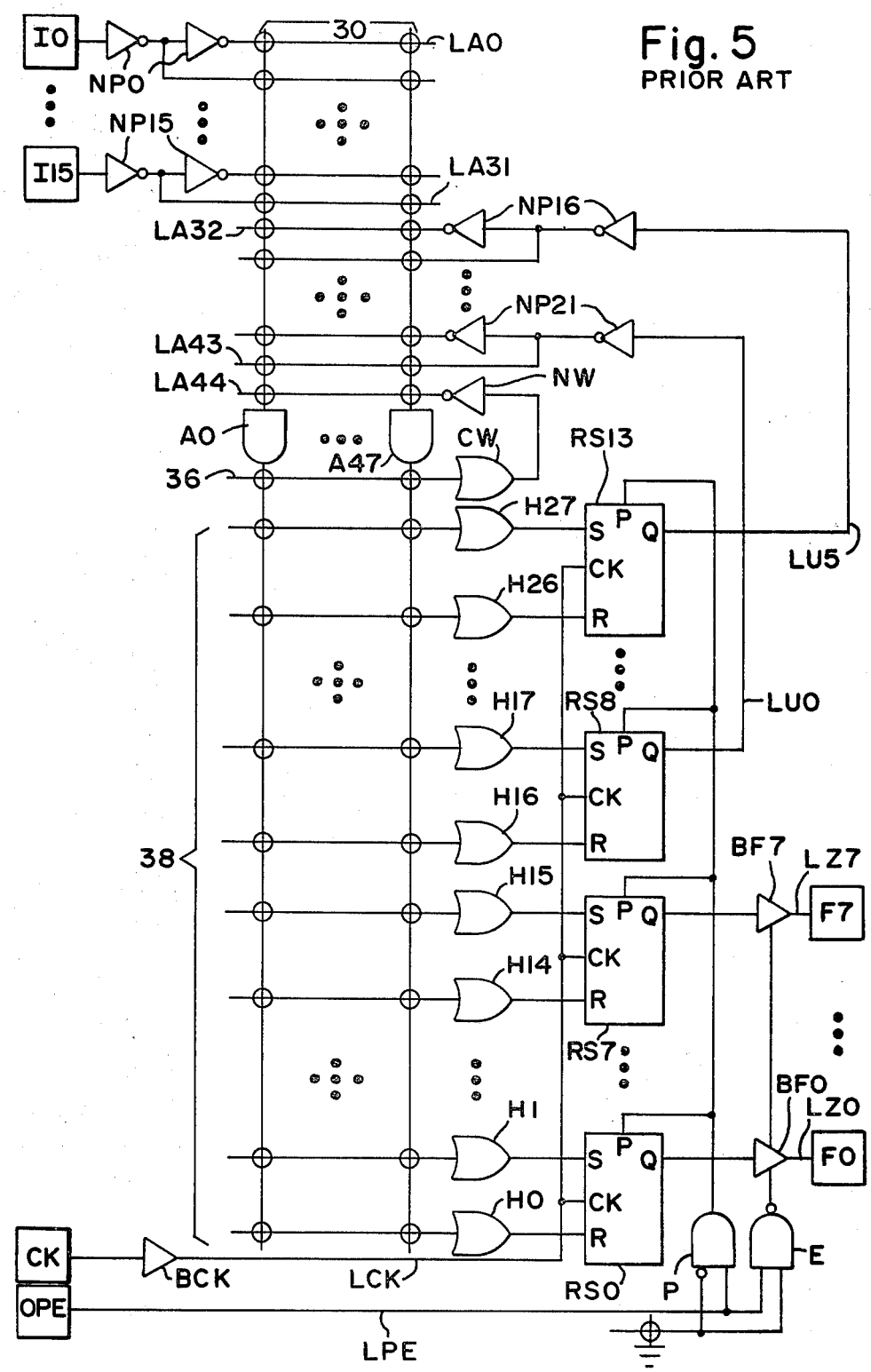

While NAND array 21 is preferably formed with Schottky diodes, it could alternatively be formed by using transistors in the manner shown for OR gate C in FIG. 2B. In this case, the opposite fusible links in array 21 would be destroyed when array 21 utilizes diodes. In this alternative situation, array 21 would actually consist of 12 OR gates each having inverted inputs rather than NAND gates AN0–AN11. However, under DeMorgan's theorem, an OR gate with inverted inputs provides precisely the same output data as a NAND gate with regular inputs and therefore functions as a NAND gate.

The data from NAND gates AN0–AN11 is then supplied to an array 23 of 12 exclusive OR gates X0–X11, respectively, which provide either the true data from gates AN0–AN11 or its complement depending on how the fusible links for grounding the second input elements of gates X0–X11 are programmed. More particularly, FIGS. 7A and 7B show, respectively, the circuitry for such a fusible link FX connected to the second input element of any exclusive OR gate X in array 23 and the representation of link FX in the simplified FPLA notation used in FIG. 6. As shown in FIG. 7A, link FX is connected between the input line LXB for the second input element of gate X and ground potential by way of a line LX. Line LXB is also connected through a resistor RX to voltage source $V_{CC}$. The first input element of gate X connects by way its first input line LXA to the output section of, for example, a NAND gate. When fuse FX is intact, gate X receives a logical "0" from line LXB and therefore transmits the true data from the NAND gate through its output element to output line OX. When fuse FX is blown, voltage $V_{CC}$ assures that a logical "1" is provided along line LXB to the second input element of gate X. As a result, exclusive OR gate X provides the complement of the data supplied from the NAND gate on line OX. In short, exclusive OR array 23 provides a capability for inverting the polarity of selected data from NAND array 21.

When NAND array 21 is formed with transistors instead of diodes as in the alternative described above, an NPN bipolar transistor having its base and collector coupled to voltage source $V_{CC}$ and its emitter coupled through resistor RX to line LXB is added to FIG. 7A to ensure circuit compatibility.

Returning to FIG. 6, the output data from gates X0–X11 is supplied through 12 output buffers BB0–B11, respectively, along 12 lines LY0–LY11, respectively, to 12 terminals B0–B11, respectively. Each buffer BB0 . . . or BB11 has a corresponding buffer control line LBB0 . . . or LBB11 for receiving control data to enable or disable that buffer BB0 . . . or BB11 and thereby permit or inhibit, respectively, data transmission along corresponding line LY0 . . . or LY11 to corresponding pin B0 . . . or B11.

Each buffer control line LBB0 . . . or LBB11 is connected through a fusible link to the output line of a control AND gate. FIGS. 8A and 8B depict, respectively, the circuitry associated with any one of these fusible links and its representation in the simplified FPLA notation used in FIG. 6. As shown in FIG. 8A, the output line OD from the output section of an AND gate D connects to a buffer BDA whose output is connected to the buffer control line LBB for a typical output buffer BB. Line LBB is coupled through a resistor RDA to voltage source $V_{CC}$. Buffer BDA has a buffer control line LBDA connected through a typical fusible link FD to voltage source $V_{CC}$ by way of a buffer BDB. Control line LBDA is also connected to ground through a resistor RD When fusible link FD is intact, voltage source $V_{CC}$ provides a logical "1" along line LBDA to enable buffer BDA and thereby allow control data to pass from gate D through buffer BDA to control line LBB so as to enable or disable buffer BB depending on whether the control data is logical "1" or logical "0", respectively. When fuse FD is destroyed, resistor RDB brings line LBDA down to logical "0" to disable buffer BDA and prevent the transmission of any control data from gate D to buffer BB. The disablement of buffer BDA effectively creates an open circuit between buffers BB and BDA and therefore electronically separates buffer control line LBB from the output section of gate D. Control line LBB is forced to logical "1" by resistor RDA to permanently enable buffer BB. Returning again to FIG. 6, when the fusible link for buffer control line LBB0 . . . or LBB11 along any particular output buffer BB0 . . . or BB11 is blown, corresponding output terminal B0 . . . or B11 thereby functions unconditionally to provide output data from corresponding gate X0 . . . or X11.

The four buffer control lines LBB8–LBB11 connect through their fusible links to the output line OD0 of a control AND gate D0. Likewise, the four lines LBB4–LBB7 and the four lines LBB0–LBB3 connect to the output lines OD1 and OD2 of control AND gates D1 and D2, respectively. By leaving the fuses for any group of buffers BB8–BB11, BB4–BB7, or BB0–BB3 intact, that group can be controlled together through its AND gate D0, D1, or D2. Of course, any buffer BB0 . . . or BB11 can be switched from group control to permanent use for transmitting output data by simply blowing its fusible link.

Control gates D0–D2 form a programmable control array 25 for ANDing data on lines LA0–LA35. As with gates AN0–AN11 each of gates D0–D2 has 36 input sections and is configured as shown in FIG. 1A.

Output data transmitted through buffers BB0–BB11 on lines LY0–LY11 is fed back on 12 lines LT0–LT11 to AND arrays 21 and 25. In particular, the true data and its complement on lines LT0–LT11 are provided from 12 inverter pairs NP6–NP17, respectively, to lines LA12–LA35 in the same manner as inverter pairs NP0–NP5 are used. This feedback path allows the present single level logic circuit to be programmed to execute sequences such as shift, skip, branch, and looping control.

The feedback path also provides a capability for using pins B0–B11 as circuit input terminals. By leaving the fusible link for any buffer BB0 . . . or BB11 intact and leaving intact at least the two fusible links connecting the output section of the corresponding gate D0 . . . or D2 to its input sections coupled to any single inverter pair NP0 . . . or NP17, that buffer BB0 . . . or BB11 is permanently disabled thereby permitting corresponding pin B0 . . . or B11 to serve unconditionally as a circuit input terminal for providing input data to arrays 21 and 25 by way of corresponding line LT0 . . . or LT11. Generally, this is accomplished by leaving intact all the fusible links for that gate D0 . . . or D2. Furthermore, by leaving the fusible link for any buffer BB0 . . . or BB11 intact and programming an appropriate steering code on its associated control gate D0 . . . D2, corresponding pin B0 . . . or B11 can dynamically switch between a circuit output terminal for providing output data from the circuit along corresponding line LY0 . . . or LY11 and a circuit input terminal by way of the feedback path to arrays 21 and 25.

Figure 9:
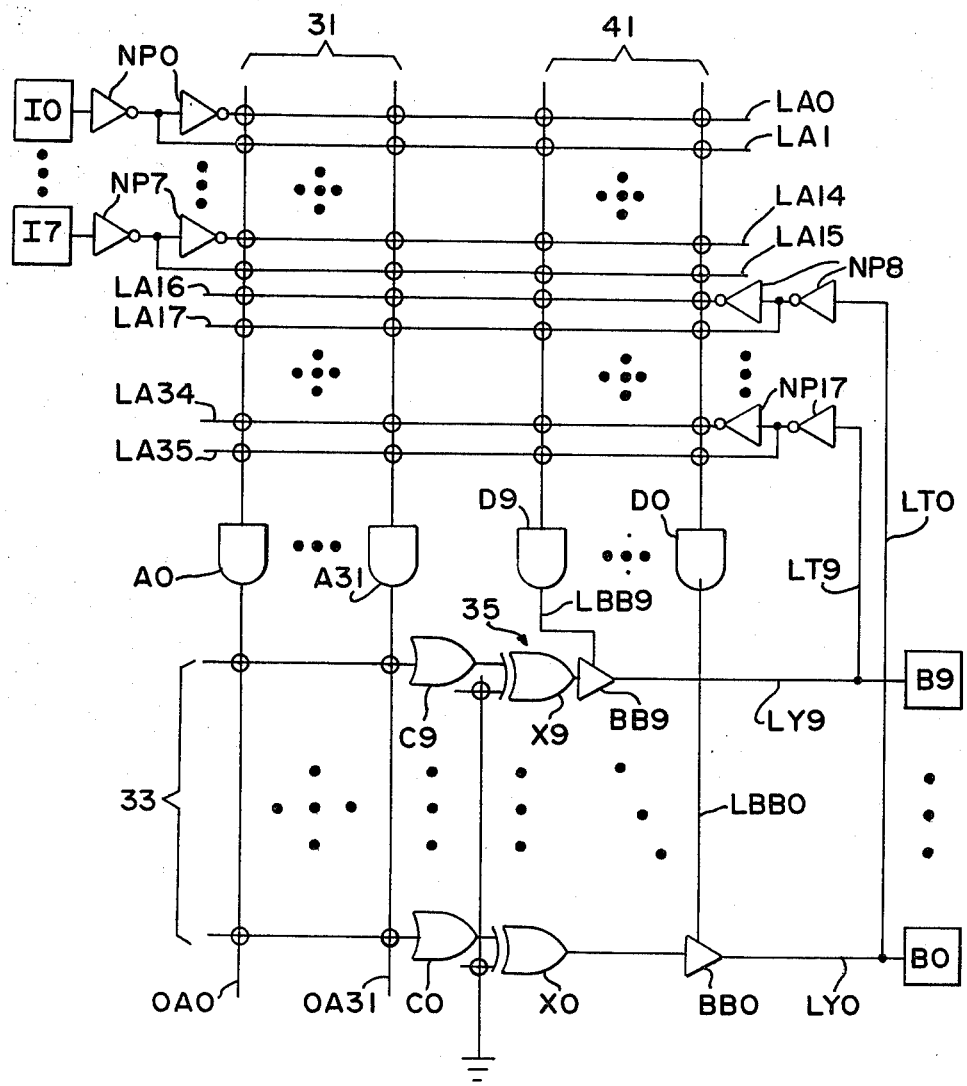
FIG. 9 is a circuit diagram for a multiple level logic FPLA circuit according to the invention.

Moving on, FIG. 9 shows a two level logic FPLA integrated circuit in its unprogrammed state. This circuit receives input data at eight fixed input terminals I0–I7. The true input data and its complement from pins I0–I7 are provided from eight inverter pairs NP0–NP7, respectively, to 16 lines LA0–LA15 in the manner described above. In addition, data is provided on 20 lines LA16–LA35. The data on lines LA0–LA35 is ANDed by programmable logic array 31 of 32 AND gates A0–A31, each having 36 input sections and configured as shown in FIG. 1A. The data on the 32 output lines OA0–OA31 from the output sections of gates A0–A31, respectively, is then ORed by a programmable logic array 33 of 10 OR gates C0–C9, each having 32 input sections and configured as shown in FIG. 2A. The data from the output sections of OR gates C0–C9 is provided to an array 35 of 10 exclusive OR gates X0–X9, respectively, which operate in the same manner as exclusive OR array 23 of FIG. 6 to provide either the true data from gates C0–C9 or its complement depending on how the fusible links for grounding the second input elements of gates X0–X9 are programmed.

The output data from gates X0–X9 is supplied through 10 output buffers BB0–BB9, respectively, along 10 lines LY0–LY9, respectively, to 10 terminals B0–B9, respectively. Each buffer BB0 . . . or BB9 has a corresponding buffer control line LBB0 . . . or LBB9 connected directly to the output section of a corresponding control AND gate D0 . . . or D9 for receiving control data to enable or disable that buffer BB0 . . . or BB9 and thereby permit or inhibit, respectively, the transmission of output data along corresponding line LY0 . . . LY9 to corresponding pin B0 . . . or B9. AND gates D0–D9 form a programmable control array 41 in which each gate D0 . . . or D9 has 36 input sections and is configured as shown in FIG. 1A. By blowing all of the fusible links for any gate D0 . . . or D9, its output permanently rises to logical "1" which is transmitted along corresponding buffer control line LBB0 . . . or LBB9 to permanently enable corresponding buffer BB0 . . . or BB9. As a result, corresponding pin B0 . . . or B9 serves unconditionally to transmit output data from the circuit.

Output data from gates X0–X9 on lines LY0–LY9 is fed back on 10 lines LT0–LT9, respectively, to AND arrays 31 and 41. In particular, the true data and its complement on lines LY0–LY9 are provided through 10 inverter pairs NP8–NP17, respectively, to lines LA16–LA35 in the manner described above. This feedback path permits the present two level logic circuit to be programmed to execute such sequences as shift, skip, branch, and looping control.

By leaving intact at least the two fusible links connecting the output section of any gate D0 . . . D9 to its input sections coupled to any single inverter pair NP0 . . . or NP17, a logical "0" is provided on corresponding control line LBB0 . . . or LBB9 to corresponding buffer BB0 . . . or BB9. This disables that buffer BB0 . . . or BB9 so that corresponding pin B0 . . . or B9 can be used unconditionally to provide input data to AND arrays 31 and 43 by way of corresponding line LT0 . . . or LT9. Furthermore, by programming an appropriate steering code on any gate D0 . . . or D9, corresponding pin B0 . . . or B9 can dynamically switch between a circuit output terminal or providing output data from its output buffer BB0 . . . or BB9 and a circuit input terminal by way of the feedback path on corresponding line LT0 . . . or LT9 for receiving input data to arrays 31 and 41.

Figure 10B:
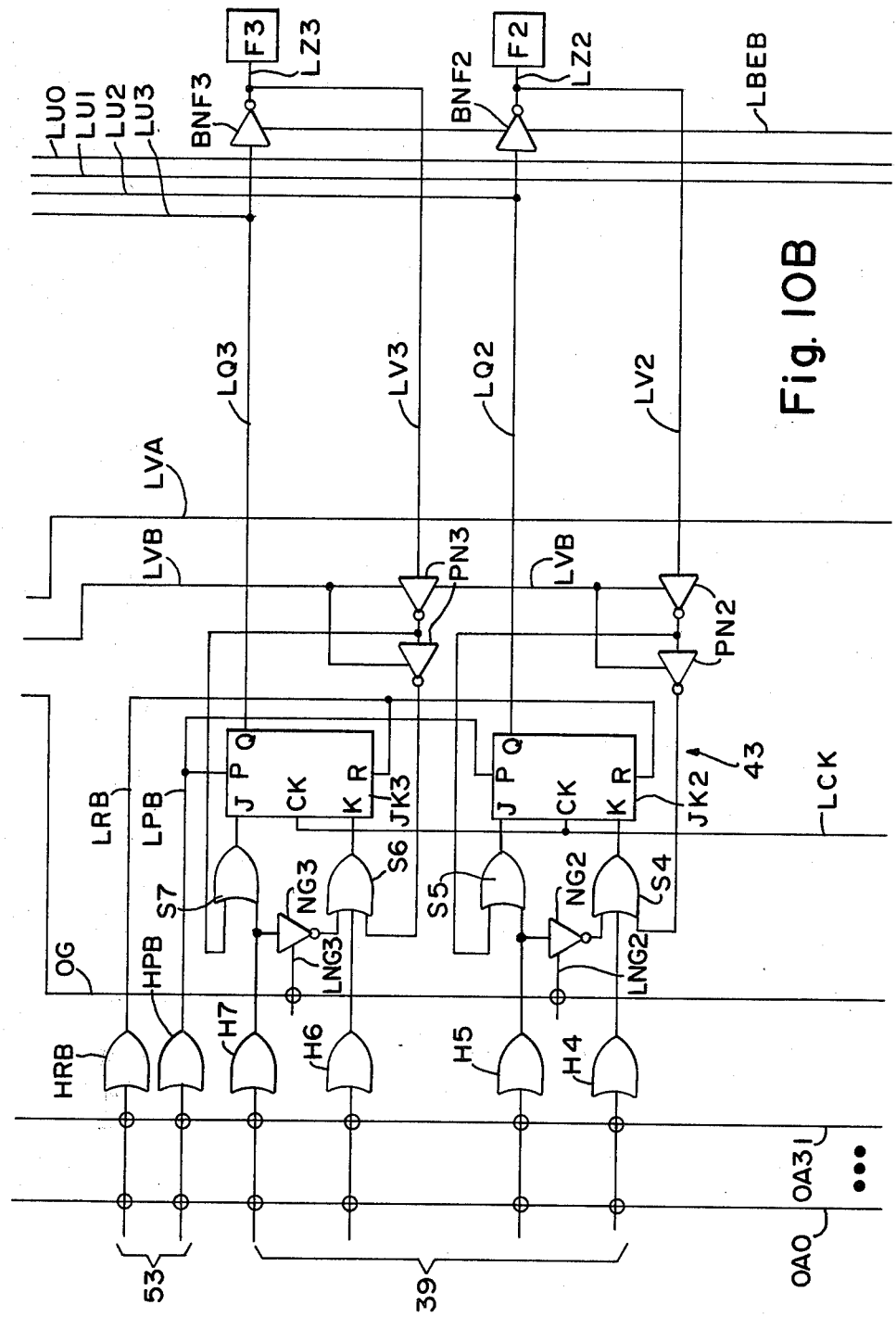
Figure 10C:
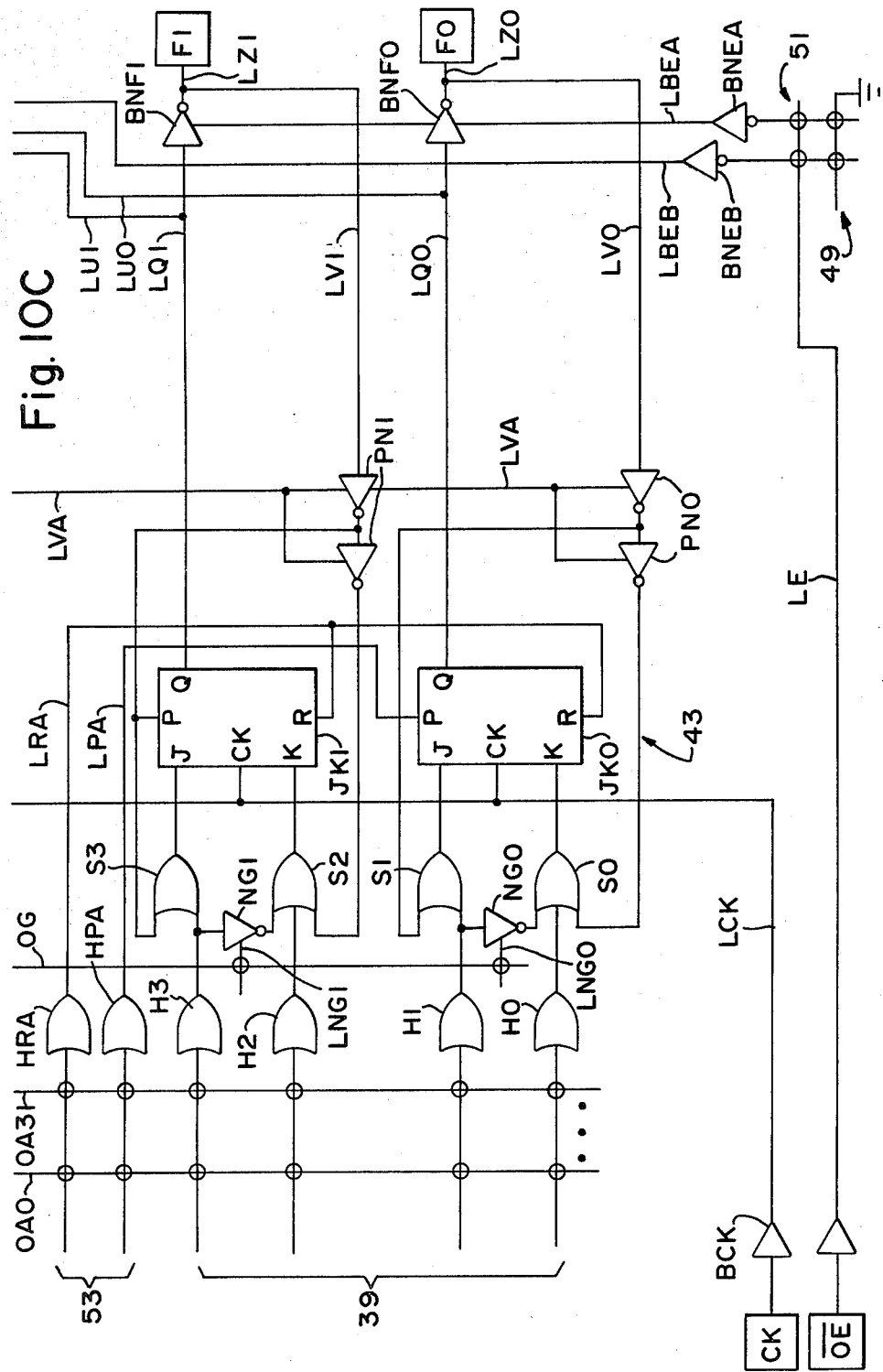

Turning to FIGS. 10A, 10B, and 10C, they illustrate a first preferred embodiment of a sequential logic FPLA integrated circuit in its unprogrammed state. This circuit receives input data at four fixed input terminals I0–I3 and supplies the true input data and its complement through four inverter pairs NP0–NP3, respectively, to eight lines LA0–LA7 in the manner described above. In addition, data is provided on 24 lines LA8–LA32. The data on lines LA0–LA32 is ANDed by programmable logic array 31 of 32 AND gates A0–A31 each having 33 input sections and configured as shown in FIG. 1A. Likewise, the data from AND gates A0–A31 is ORed by programmable logic array 33 of eight OR gates C0–C7 each having 32 input sections and configured as shown in FIG. 2A. The data from OR gates C0–C7 is then supplied to an array 35 of eight exclusive OR gates X0–X7, respectively, which are formed and operate in the same manner as exclusive OR array 35 in FIG. 9.

The data from gates X0–X7 is transmitted through eight buffer inverters BBN0–BBN7, respectively, which invert its polarity, and then along eight lines LY0–LY7, respectively to eight terminals B0–B7, respectively. The activation of buffers BBN0–BBN7 is controlled by a programmable control array 41 of eight AND gates D0–D7, respectively, each having 33 input sections sections and configured as shown in FIG. 1A. Output data transmitted through buffers BBN0–BBN7 on lines LY0–LY7 is fed back on eight lines LT0–LT7, respectively, to AND arrays 31 and 41 and also to programmable control AND arrays 45 and 47 discussed below. In particular, the true data and its complement from lines LY0–LY7 are provided through eight inverter pairs NP8–NP15, respectively, to lines LA16–LA31 in the manner described above. Except for the inversion of the polarity of the output data supplied to pins B0–B7, buffer inverters BBN0–BBN7 operate under the control of array 41 in exactly the same manner as buffers BB0–BB7 are controlled by AND array 41 of FIG. 9. Accordingly, each of pins B0–B7 can function unconditionally as a circuit output terminal for transmitting output data, can function unconditionally as a circuit input terminal to provide input data to the circuit by way of corresponding line LT0 . . . or LT7, or can be dynamically switched between a circuit output terminal and a circuit input terminal by way of its feedback path.

A programmable NOR loop 37 consisting of an OR gate CW in series with an inverter NW generates data complementary to that provided from AND arrays 31, 41, 45 and 47 and feeds the complementary data back into arrays 31, 41, 45, and 47 along line LA32. OR gate CW is configured as shown in FIG. 2A and has 43 input sections, one for each AND gate in arrays 31, 41, 45, and 47.

A programmable logic array 39 of eight OR gates H0–H7 each having 32 input sections and configured as shown in FIG. 2A. ORs the data from AND gates A0–A31. The data from the output sections of gates H0–H7 is transmitted to eight OR gates S0–S7, respectively. The data from each pair of OR gates S0–S7 is then supplied to the J and K data input terminals of a corresponding one in a set 43 of four synchronous JK flip-flops JK0–JK3 to provide on-chip data storage capability. Each flip-flop JK0 . . . or JK3 has a clock terminal (CK) for receiving a clock signal from a common clock line LCK coupled through a buffer BCK to a chip clock input pin CK.

Each flip-flop JK0 . . . or JK3 can be operated as a synchronous D flip-flop by activating a corresponding inverter NG0 . . . or NG3 coupled through the corresponding pair of OR gates S0–S7 across its J and K terminals. In particular, the output terminal of each inverter NG0 . . . or NG3 is coupled to the K terminal of corresponding flip-flop JK0 . . . or JK3. With inverter NG0 . . . or NG3 enabled by the presence of a logical "1" on line LNG0 . . . or LNG3 and in the absence of other logical "1" input to corresponding even numbered OR gate S0, S2, S4, or S6, the J and K terminals of corresponding flip-flop JK0 . . . or JK3 are forced to opposite logic states thereby causing synchronous D-type flip-flop operation. In this mode, flip-flop JK0 . . . or JK3 goes to the logical state of the data being received at its J input terminal upon the reception of each clock pulse.

Each inverter NG0 . . . or NG3 has a corresponding inverter control line LNG0 . . . or LNG3 for receiving control data to enable or disable that inverter NG0 . . . or NG3 and thereby cause or prevent, respectively, D-type flip-flop operation. Each inverter control line LNG0 . . . or LNG3 is connected through a fusible link to the output line OG of a control AND gate G. FIGS. 11A and 11B illustrate, respectively, the circuitry associated with any of these fusible links and its representation in the simplified FPLA notation used in FIGS. 10A, 10B, and 10C. As shown in FIG. 11A, a typical fusible link FG is coupled between the control line LNG for a typical inverter NG and line OG of the output section of gate G by a buffer BG. Inverter control line LNG is also connected to ground by way of a resistor RG. When link FG is blown, resistor RG brings line LNG down to logical "0" to disable inverter NG so that its JK flip-flop does not operate in D mode. When link FG is intact, gate G controls the activation of inverter NG. Returning to FIGS. 10A, 10B, and 10C, destruction of the fusible link for any inverter NG0 . . . or NG3 therefore forces corresponding flip-flop JK0 . . . JK3 unconditionally to JK mode.

Gate G, which controls all inverters NG0–NG3 as a group when their fusible links are intact, is a programmable control (linear) array 45 for ANDing data on lines LA0–LA32. As with gates A0–A31, gate G has 33 input sections and is configured as shown in FIG. 1A. By leaving the fusible link for any inverter NG0 . . . or NG3 intact and leaving intact at leat thw two fusible links connecting the output section of gate G to its input sections coupled to any single inverter pair NP0 . . . or NP15, that inverter NG0 . . . or NG3 is again disabled, forcing its flip-flop JK0 . . . or JK3 again unconditionally to JK mode. However, by leaving the fusible link for any inverter NG0 . . . or NG3 intact and programming an appropriate steering code on gate G, corresponding flip-flop JK0 . . . or JK3 can dynamically switch between D mode and JK mode.

The output data from the Q output terminals of flip-flops JK0–JK3 is transmitted on four lines LQ0–LQ3, respectively, through four buffer inverters BNF0–BNF3, respectively, where it is inverted and along four lines LZ0–LZ3, respectively, to four terminals F0–F3, respectively. The output data from flip-flops JK0–JK3 is also fed back directly on four lines LU0–LU3, respectively, to AND arrays 31, 41, 45 and 47. The true data and its complement from lines LU0–LU3 are provided through four inverter pairs NP4–NP7, respectively, to lines LA8–LA15 in the manner described above.

In another feedback path the output data from flip-flops JK0–JK3 on lines LZ0–LZ3 is transmitted along four lines LV0–LV3 respectively, to four inverter pairs PN0–PN3, respectively, where the true data and its complement are divided and transmitted to the K and J terminals, respectively of flip-flops JK0–JK3 through the corresponding pairs of OR gates S0–S7. Inverter pairs PN0 and PN1 have a common control line LVA for receiving data to control their activation. Likewise, inverter pairs PN2 and PN3 have a common control line LVB for receiving data to control activation. Each line LVA or LVB is connected to the output section of a corresponding control AND gate VA or VB. Gates VA and VB form a programmable control array 47 for ANDing data on lines LA0–LA31. Each gate VA or VB has 33 input sections and is configured as shown in FIG. 1A. By leaving intact at least the two fusible links connecting the output section of gate VA or VB to its input section coupled to any single inverter pair NP0 . . . or NP15, the corresponding pair of inverter pairs PN0 and PN1 or PN2 and PN3 are permanently disabled, thereby preventing data from being transmitted along corresponding line pair LV0 and LV1 or LV2 and LV3 to the J and K terminals of corresponding flip-flop pair JK0 and JK1 or JK2 and JK3. By programming an appropriate steering code on control gate VA or VB, the corresponding pair of inverter pairs PN0 and PN1 or PN2 and PN3 can be dynamically controlled, thereby permitting or inhibiting the transmission of data on corresponding line pair LV0 and LV1 or LV2 and LV3 to corresponding flip-flop pair JK0 and JK1 or JK2 and JK3. When data is transmitted along feedback path LV0 and LV1 or LV2 and LV3 to its flip-flop pair JK0 and JK1 or JK2 and JK3, each of AND gates A0–A31 actually driving that flip-flop pair JK0 and JK1 or JK2 and JK3 should be disabled to prevent data entry from multiple sources.

As with inverter control line LVA, buffers BNF0 and BNF1 have a common buffer control line LBEA for receiving data to enable or disable them together and thereby permit or inhibit, respectively, data transmission along lines LZ0 and LZ1 to pins F0 and F1. Likewise, as with inverter control line LVB, buffers BNF2 and BNF3 have a common buffer control line LBEB for receiving control data to enable or disable them together and similarly permit or inhibit, respectively, data transmission to pins F2 and F3. Each buffer control line LBEA or LBEB is connected through a corresponding inverter BNEA or BNEB to a pair of fusible links, one leading to ground, the other going to a line LE connected to a terminal $\overline{OE}$ for receiving enable/-disable data. The fusible links coupling lines LBEA and LBEB to ground are generally indicated at 49, while the fusible links coupling lines LBEA and LBEB to line LE are generally indicated at 51. FIGS. 12A and 12B illustrate, respectively, the circuitry associated with either pair of the fusible links at 49 and 51 and their representation in the simplified FPLA notation used in FIGS. 10A, 10B, and 10C. As shown in FIG. 12A, a typical inverter BNE coupled between line LE and a typical buffer control line LBE has an inverter control line LBNE connected to the output of an inverter NE49 whose input is connected to voltage source $V_{CC}$ through a fusible link FE49 and is coupled to ground through a resistor RE49. Line LE feeds into the input section of an OR gate AE51 whose output is transmitted along a line LAE51 to the input of inverter BNE. A second input to OR gate AE51 is provided along a line LNE51 from the output of an inverter NE51 whose input is connected through a fuse FE51 to voltage source $V_{CC}$ and is also coupled to ground through a resistor RE51.

When fusible link FE49 is intact, voltage source $V_{CC}$ provides a logical "1" to the input of inverter NE49 which therefore provides a logical "0" to the control input of inverter BNE thereby disabling it. This both prevents the transmission of enable/disable data from line LE through inverter BNE and creates an open circuit between inverter BNE and the control input of a typical buffer inverter BNF so that it is permanently activated. When fuse FE49 is destroyed, resistor RE49 brings the input of inverter NE49 to logical "0" so that inverter NE49 transmits a logical "1" to the control input of inverter BNE to activate it. If fusible link FE51 is intact, voltage source $V_{CC}$ supplies a logical "1" to inverter NE51 which then supplies a logical "0" to OR gate AE51. This permits the transmission of enable/disable data through gate AE51 and inverter BNE to the control input of buffer BNF so that it can be externally controlled. When fusible link FE51 is destroyed, resistor RE51 causes a logical "1" to be transmitted to the second input of gate AE51 so that it permanently supplies a logical "1" to inverter BNE which therefore supplies a logical "0" to the control input of buffer BNF so that it is permanently disabled.

Returning to FIGS. 10A, 10B, and 10C, the following results. When either line LBEA or LBEB is permanently coupled to ground by leaving the corresponding fuse at 49 intact, corresponding buffer pair BNF0 and BNF1 or BNF2 and BNF3 are permanently enabled so that corresponding pin pair F0 and F1 or F2 and F3 function unconditionally as circuit output terminals. When line LBEA or LBEB is coupled to line LE and separated from ground, corresponding pin pair F0 and F1 or F2 and F3 are externally controllable either as circuit output pins or as circuit input pins by way of corresponding feedback line pair LV0 and LV1 or LV2 and LV3 for forcing data into the J and K terminals of corresponding flip-flop pair JK0 and JK1 or JK2 and JK3. Before data can be entered into either pair of flip-flops JK0 and JK1 or JK2 and JK3 through the feedback path on lines LV0 and LV1 or LV2 and LV3, the corresponding pair of inverter pairs PN0 and PN1 or PN2 and PN3 must be enabled by its control gate VA or VB. When both fusible links for either line LBEA or LBEB are blown, corresponding buffer pair BNF0 and BNF1 or BNF2 and BNF3 are permanently disabled, so that corresponding pin pair F0 and F1 or F2 and F3 serve unconditionally as circuit input terminals by way of the feedback path to corresponding flip-flop pair JK0 and JK1 or JK2 and JK3.

The various feedback paths allow the present logic sequencer to be programmed to execute elementary sequences such as shift, skip, and branch as well as more advanced operations such as subroutines, controllers, filters, count up and count down.

Each flip-flop JK0 . . . or JK3 has internal control circuitry which includes a pair of preset and reset control terminals (P and R) for setting that flip-flop JK0 . . . or JK3 asynchronously at either logical "1" or logical "0". As with inverter control line LVA, flip-flop pair JK0 and JK1 have a common preset control line LPA for receiving preset control data at their preset terminals to force line pair LQ0 and LQ1 to logical "1" and a common reset control line LRA for receiving reset control data at their reset terminals to force line pair LQ0 and LQ1 to logical "0". Likewise, as with line LVB, flip-flop pair JK2 and JK3 have a common preset control line LPB for receiving control data at their preset terminals to force line pair LQ2 and LQ3 to logical "1" and a common reset control line LRB for receiving control data at their reset terminals to force lin pair LQ2 and LQ3 to logical "0".

Each line LPA, LRA, LPB, or LRB is connected to the output section of a corresponding OR gate HPA, HRA, HPB, or HRB. Gates HPA, HRA, HPB, and HRB form a programmable control array 53 for ORing the data from the output sections of AND gates A0–A31. Each gate HPA, HRA, HPB or HRB has 32 input sections and is configured as shown in FIG. 2A. When all the fusible links for any gate HPA or HPB are blown, its output section permanently supplies a logical "0" on corresponding control line LPA or LPB so as to unconditionally disable the preset capability of corresponding flip-flop pair JK0 and JK1 or JK2 and JK3. The same holds for the reset capability when all the fusible links for gate HRA or HRB are blown. By programming appropriate steering codes on gates HPA, HRA, HPB, and HRB, flip-flop pair JK0 and JK1 and JK2 and JK3 can be dynamically preset/reset as desired.

Figure 13A:
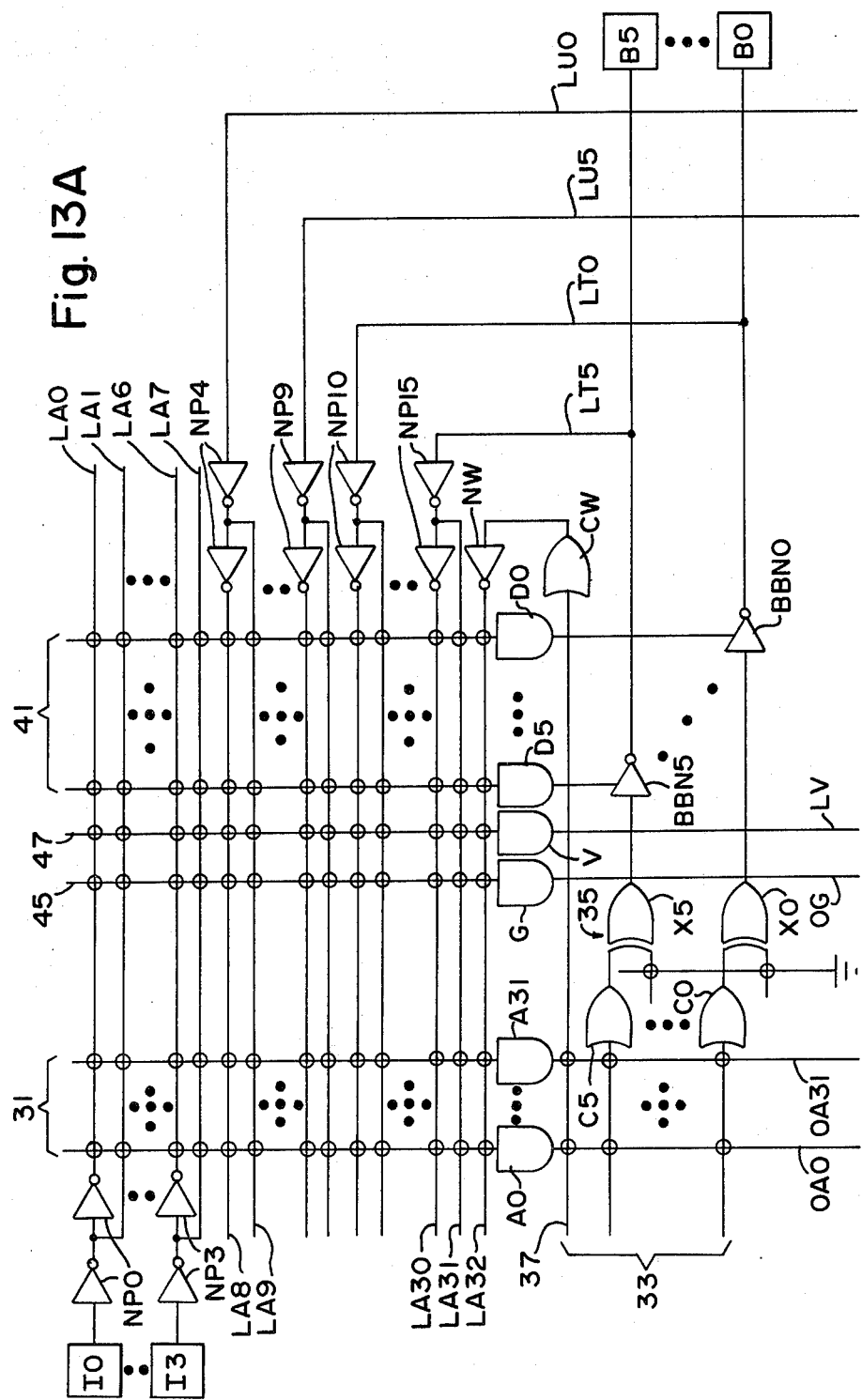
FIGS. 13A and 13B together are a circuit diagram of a second preferred embodiment of a sequential logic FPLA circuit according to the invention.
Figure 13B:
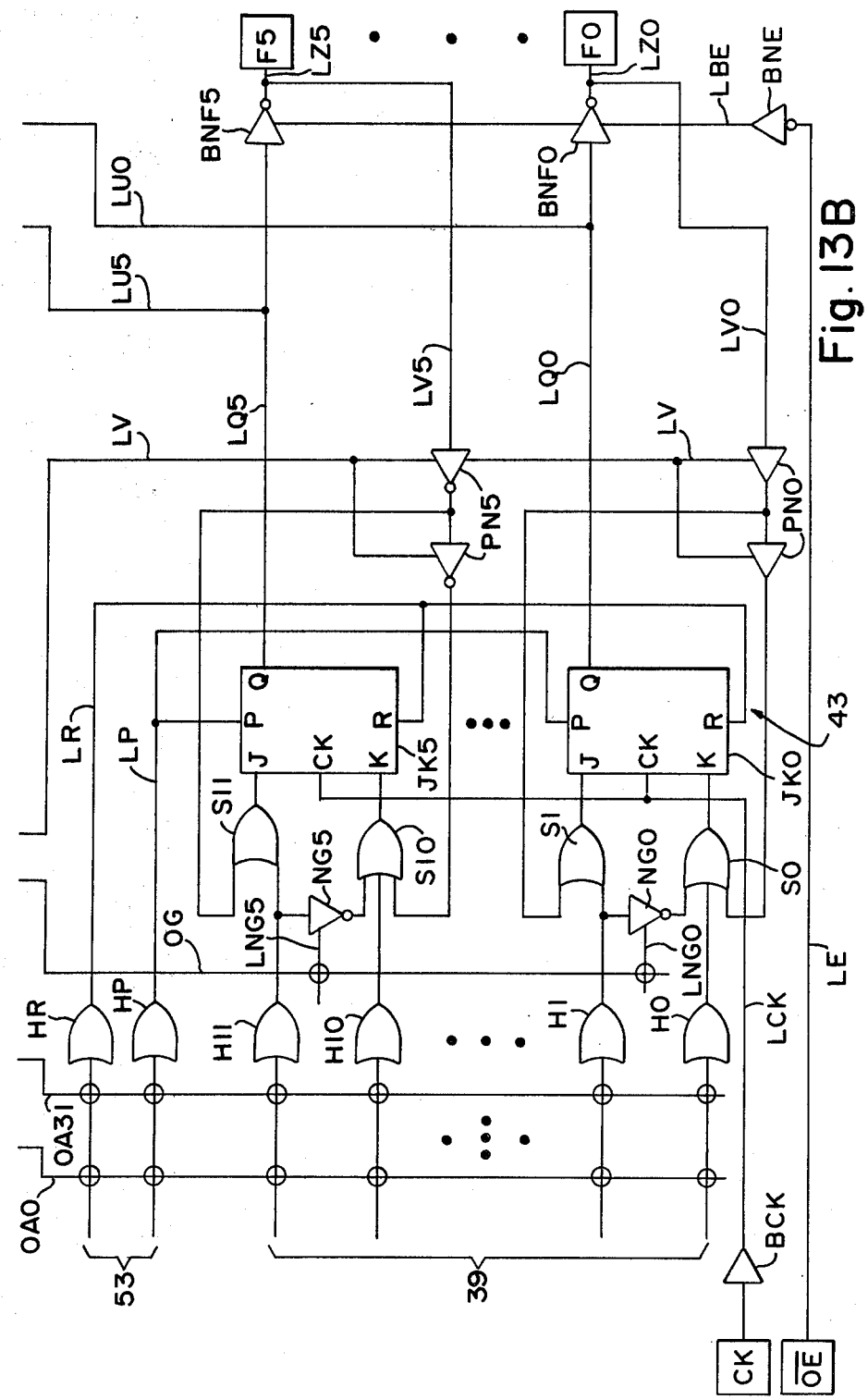
Figure 14A:
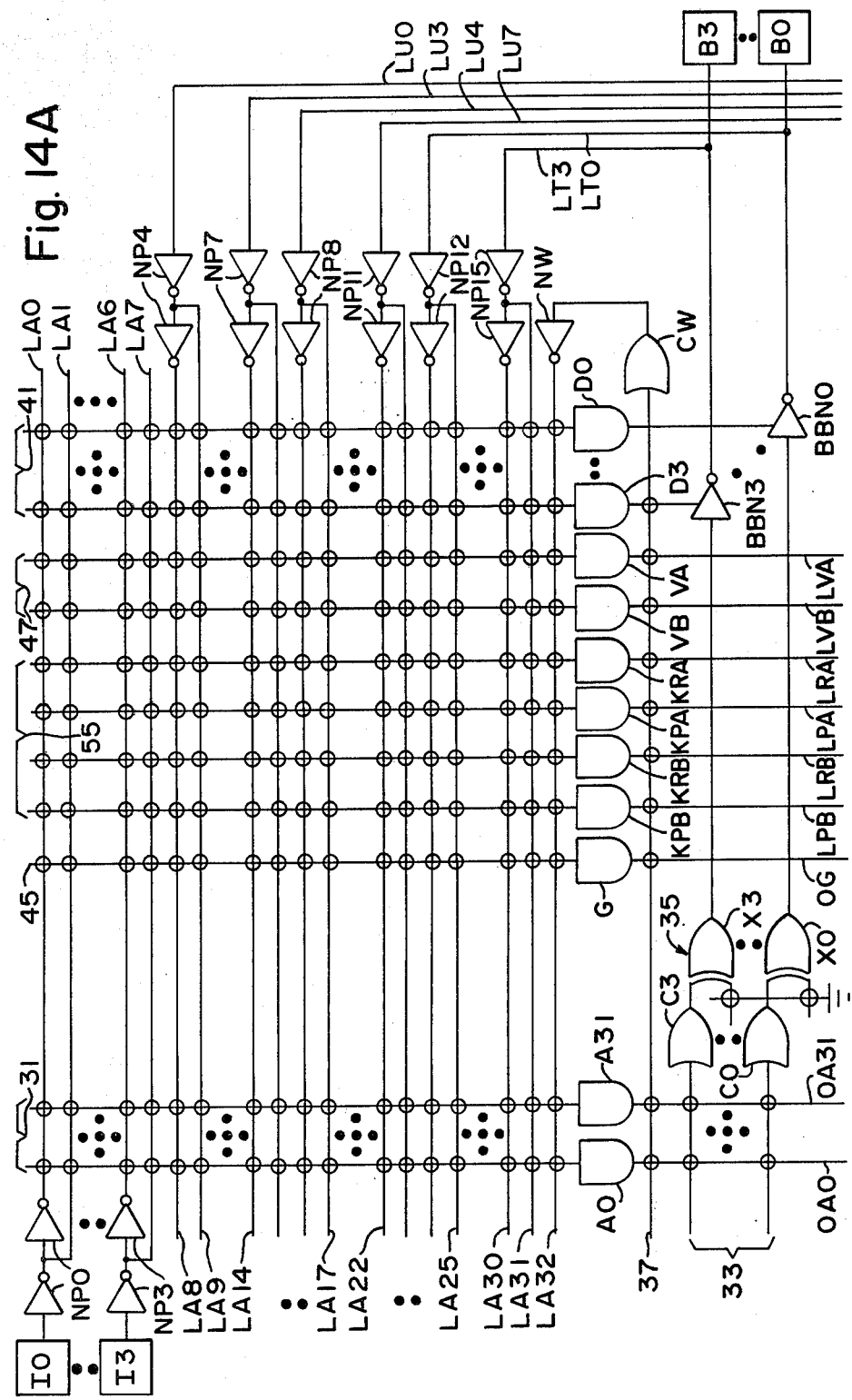
FIGS. 14A, 14B, and 14C together are a circuit diagram of a third preferred embodiment of a sequential logic FPLA circuit according to the invention.
Figure 14B:
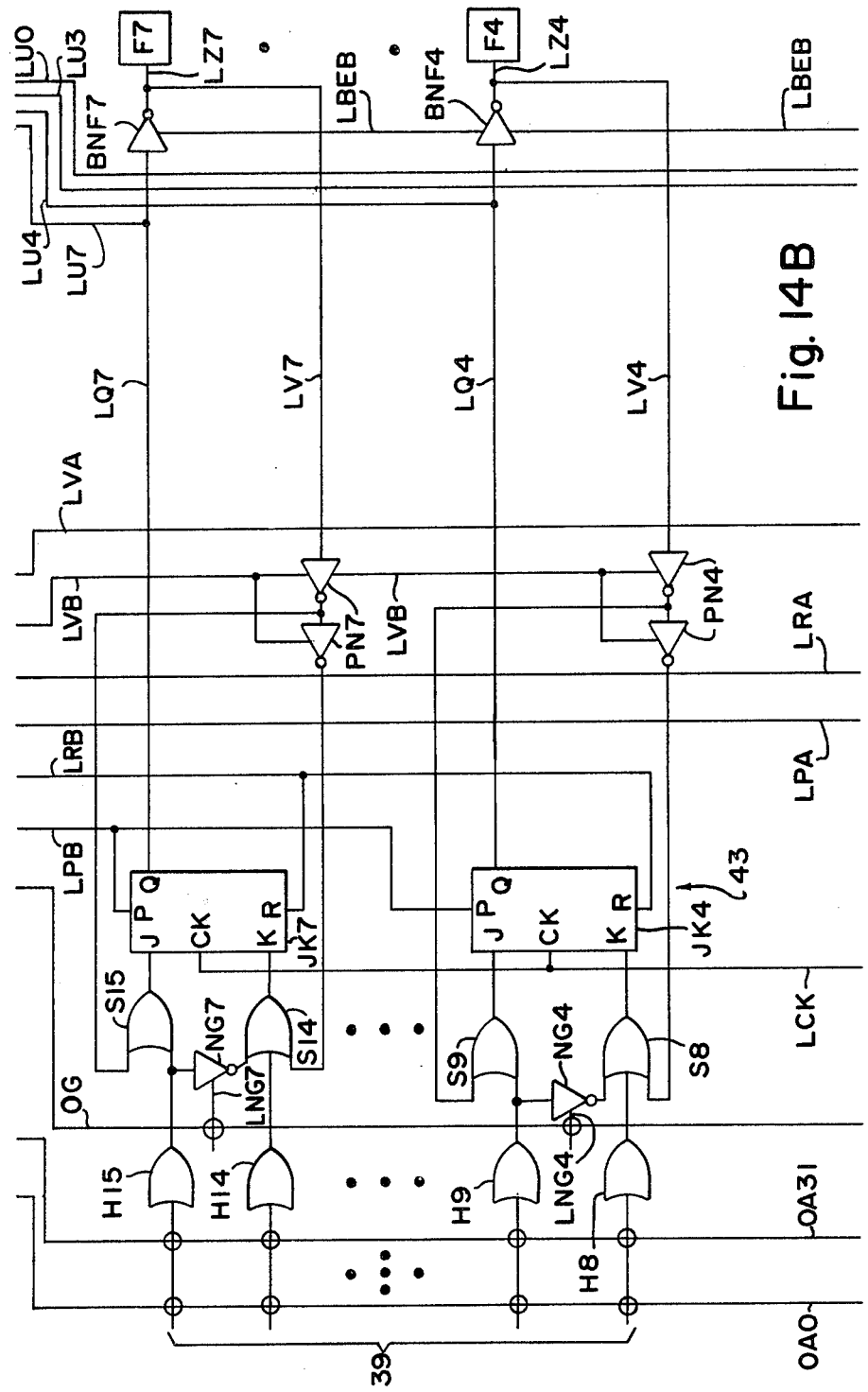
Figure 14C:
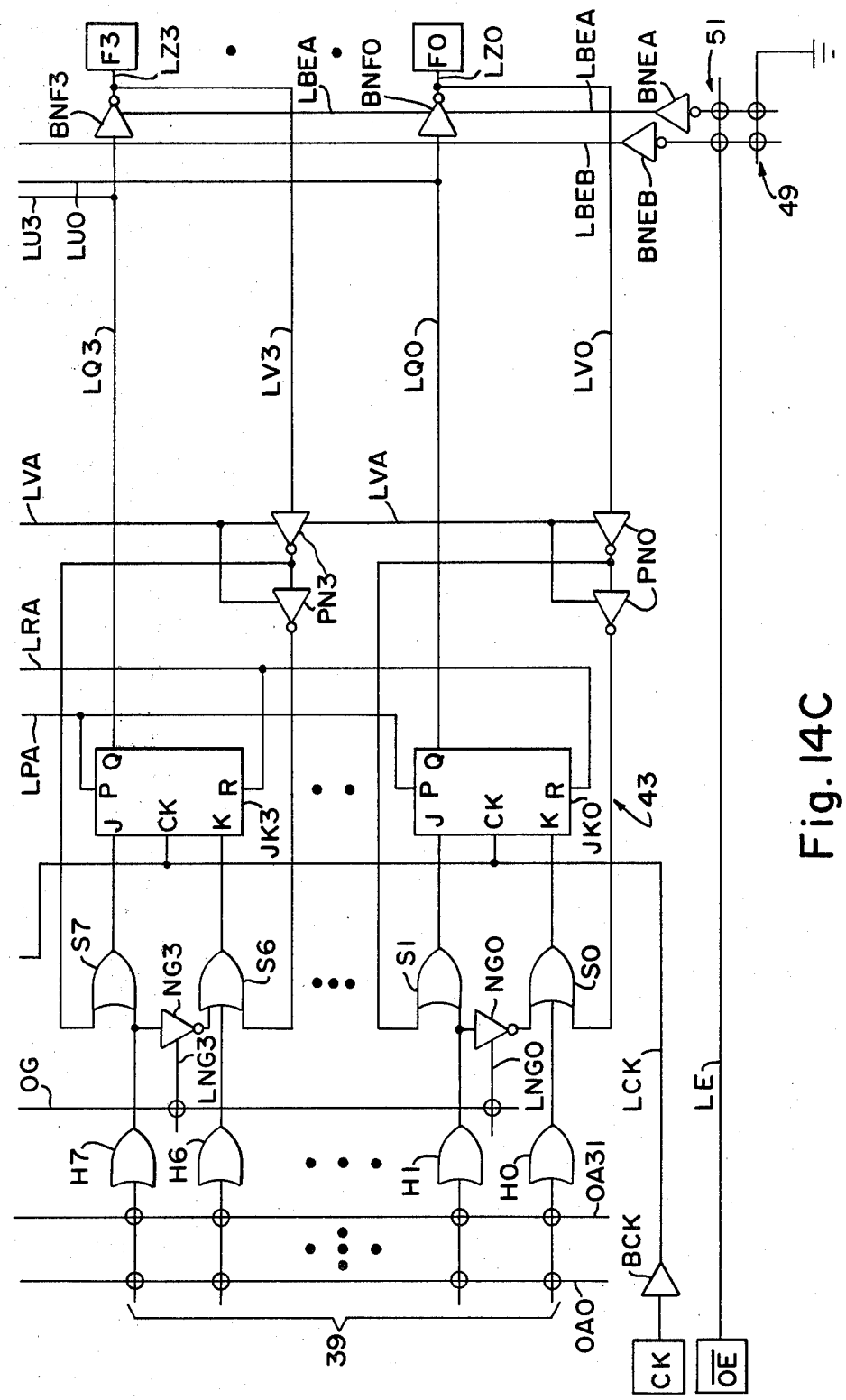

Moving to FIGS. 13A and 13B, they illustrate a second preferred embodiment of an unprogrammed sequential logic FPLA circuit. Similarly, FIGS. 14A, 14B, and 14C show a third preferred embodiment of an unprogrammed sequential logic FPLA circuit. The second and third preferred embodiments of the logic sequencer are quite similar to the first preferred embodiment described above. In view of this, the second and third preferred embodiments will be described in summary fashion with emphasis on the areas where they differ from the first preferred embodiment.

Referring to FIGS. 13A and 13B, the second logic sequencer has input pins I0–I3, logic AND array 31, logic OR array 33, exclusive OR array 35, NOR loop 37, logic OR array 39, control AND array 41, flip-flop set 43, control AND array 45, control AND array 47, control OR array 53, and feedback paths all configured and operable the same as in the first logic sequencer except that there are only six gates in each of arrays 33, 35, and 41, there are 12 gates in array 39, and there are six JK flip-flops in set 43. Accordingly, there are six B terminals B0–B5 and six F terminals F0–F5. There is only one gate in array 47, one preset gate in array 53 and one reset gate in array 53 so that feedback into and preset/reset operation of all the JK flip-flop are controllable as a single group (rather than as a pair of groups as in the first logic sequencer). Also, the second logic sequencer has no fusible links for programmably controlling the six buffer inverters BNF0–BNF5 connecting to pins F0–F5. Instead, buffers BNF0–BNF5 are directly controlled at all times through the control data supplied to pin OE.

Referring next to FIGS. 14A, 14B, and 14C, the third logic sequencer has pins I0–I3, logic arrays 31, 33, and 39, loop 37, array 35, flip-flop set 43, control arrays 41, 45, and 47, and feedback paths all configured and operable the same as in the first logic sequencer except that there are only four gates in each of arrays 33, 35 and 41, there are 16 gates in array 39, and there are eight JK flip-flops JK0–JK7 in set 43. Accordingly, there are four B terminals B0–B3 and eight F terminals F0–F7. In array 47, control gate VA controls feedback data input into flip-flop quartet JK0–JK3 by way of common inverter control line LVA connecting to the control inputs of the corresponding quartet of inverter pairs PN0–PN3. Control gate VB similarly controls feedback data input into flip-flop quartet JK4–JK7.

The preset/reset operation of flip-flops JK0–JK7 in the third logic sequencer is controlled by a programmable AND array 55 rather than by OR array 53. Control array 55 consists of four AND gates KPA, KRA, KPB, and KRB each configured as shown in FIG. 1A and having 33 input sections for ANDing the data on lines LA0–LA32. The preset terminals of flip-flop quartet JK0–JK3 or JK4–JK7 are connected by way of corresponding line LPA or LPB to the output section of its control gate KPA or KPB, and the reset terminals are similarly connected by line LRA or LRB to the output section of corresponding control gate KRA or KRB. By leaving intact at least the two fusible links connecting the output section of gate KPA or KPB to its input sections coupled to any single inverter pair NPO . . . or NP15, its output section supplies a logical "0" on line LPA or LPB so as to unconditionally disable the preset capability of corresponding flip-flop quartet JK0–JK3 or JK4–JK7. The same holds for the reset capability with regard to gate KRA or KRB. By programming suitable steering codes on gates KPA, KRA, KPB and KRB, flip-flop quartets JK0–JK3 and JK4–JK7 can be dynamically preset/reset as desired. Also, NOR loop 37 passes around gates KPA, KRA, KPB, and KRB.

The present FPLA circuits are all made according to conventional processing techniques. All of the fusible links utilized in the FPLA circuits of the invention are preferably conventional nichrome fuses except that the fusible links used in the single level circuit are preferably conventional titanium-tungsten fuses. The fuses are selectively blown according to standard techniques to program the circuits. Preferably, the semiconductor chip for each of the present integrated circuit contains on-chip programming circuitry for blowing the selected fuses.

Instead of an alloy of nickel and chromium, or an alloy of titanium or tungsten, each fuse could be made of other metals. Diode links or other types of destructible links could be used instead of heat-destructible metal fusible links. Furthermore, each link for each AND/NAND or OR/NOR gate could be located upstream of the diode or transistor in the corresponding input section of that gate rather than downstream as described above. In this case, each input section would extend upstream of the corresponding link, so that destruction of the link would still separate that input section from its output section.

While the invention has been described with reference to particular embodiments this is solely for the purpose of illustration. For example, PNP bipolar transistors could be employed in lieu of NPN transistors in the AND/NAND gates. Fieldeffect transistors could similarly be employed. Each programmable AND/NAND array using diodes may alternatively be made with NOR/OR gates that function as AND/NAND gates but utilize inverted inputs, transistors, and inverting output buffers. Likewise, each programmable OR/NOR array using transistors may alternatively be made with NAND/AND gates that function as OR/NOR gates but utilize inverted inputs, diodes, and inverting ouput buffers. Thus, various changes and modifications may be made by those skilled in the art without departing from the true scope and spirit of the invention as defined by the appended claims.

What is claimed is:

1. A programmable logic circuit characterized as comprising:
    a plurality of first lines, one part of which comprises input lines for receiving input data to the circuit and another part of which comprises feedback lines;
    a plurality of logic AND/NAND gates, each having an output section and having a plurality of input sections each connected to a different one of the first lines;
    a plurality of second lines corresponding on a one-to-one basis to the logic gates for transmitting output data respectively from their output sections;
    feedback means for supplying output data from the second lines to the feedback lines;
    a plurality of buffers corresponding on a one-to-one basis to at least part of the logic gates and respectively coupled between their output sections and the second lines, each buffer having a buffer control line for receiving control data to control activation of that buffer;
    at least one control AND/NAND gate, each having an output section coupled to at least two of the buffer control lines and having a plurality of input sections each connected to a different one of the first lines; and
    programmable means for selectively connecting each input section of each AND/NAND gate to its output section.

2. A programmable logic circuit having: a plurality of first lines, at least part of which are input lines for receiving input data to the circuit; a plurality of logic AND/NAND gates, each having an output section and a plurality of input sections each connected to a different one of the first lines; logic programmable means for selectively separating each input section of each logic gate from its output section; a plurality of second lines corresponding respectively to the logic gates for transmitting output data from their output sections; and a plurality of buffers coupled respectively between the output sections of at least part of the logic gates and the corresponding second lines, each buffer having a buffer control line for receiving control data to control activation of that buffer; characterized by:
    feedback means for supplying output data from the second lines to selected ones of the first lines exclusive of the input lines;
    at least one control AND/NAND gate, each having an output section coupled to at least two of the buffer control lines and having a plurality of input sections each connected to a different one of the first lines; and
    control programmable means for selectively separating each input section of each control gate from its output section.

3. A circuit as in claim 1 or 2 characterized by programmable means for selectively permanently electrically separating each buffer control line from the output section of the associated control gate, a terminal connected to any particular one of the second lines whose buffer has its buffer control line so separated thereby functioning unconditionally to provide output data from the circuit.

4. A circuit as in claim 3 characterized in that suitable programming of the control programmable means enables a terminal connected to any particular one of the second lines downstream of the corresponding buffer to switch dynamically between functioning as a circuit output terminal for providing output data from the circuit and as a circuit input terminal by way of the feedback means for receiving input data to the circuit.

5. A circuit as in claim 4 characterized by means for selectively inverting the polarity of output data from the logic gates.

6. A circuit as in claim 5 characterized in that the means for selectively inverting comprises: a plurality of exclusive OR gates corresponding on a one-to-one basis to at least part of the logic gates, each exclusive OR gate having an output element coupled to the corresponding second line, a first input element coupled to the output section of the corresponding logic gate, and a second input element; and programmable means for selectively coupling each second input element to a logical zero source.

7. A programmable logic circuit characterized as comprising:
    a plurality of first lines, one part of which comprises input lines for receiving input data to the circuit and another part of which comprises feedback lines;
    a plurality of logic AND/NAND gates, each having an output section and having a plurality of input sections each connected to a different one of the first lines;
    logic programmable means for selectively connecting each input sedction of each logic AND/NAND gate to its output section;
    a plurality of logic OR/NOR gates, each having an output section and having a plurality of input sections each coupled to a different one of the output sections of the logic AND/NAND gates;

logic programmable means for selectively connecting each input section of each logic OR/NOR gate to its output section;

a plurality of second lines corresponding on a one-to-one basis to the logic OR/NOR gates for transmitting output data from their output sections;

means for selectively inverting the polarity of output data from the logic OR/NOR gates on the second lines;

programmable means for selectively inhibiting the transmission of output data on the second lines; and feedback means for supplying output data from the second lines to the feedback lines.

8. A programmable logic circuit having: a plurality of first lines at least part of which are input lines for receiving input data to the circuit; a plurality of logic AND/NAND gates, each having an output section and a plurality of input sections each connected to a different one of the first lines; a plurality of logic OR/NOR gates, each having an output section and a plurality of input sections each coupled to a different one of the output sections of the logic AND/NAND gates; logic programmable means for selectively separating each input section of each logic gate from its output section; a plurality of second lines corresponding respectively to the logic OR/NOR gates for transmitting output data from their output sections; and means for selectively inverting the polarity of output data from the logic OR/NOR gates on the second lines; characterized by:

feedback means for supplying output data from the second lines to feedback lines which are selected ones of the first lines exclusive of the input lines; and programmable means for selectively inhibiting the transmission of output data on the second lines.

9. A circuit as in claim 7 or 8 characterized in that the means for selectively inhibiting comprises:

a plurality of buffers corresponding on a one-to-one basis to at least part of the logic OR/NOR gates and respectively coupled between their output sections and the second lines, each buffer having a buffer control line for receiving control data to control activation of that buffer;

at least one control AND/NAND gate, each having an output section coupled to at least one of the buffer control lines and having a plurality of input sections each connected to a different one of the first lines; and control programmable means for selectively connecting each input section of each control gate to its output section.

10. A circuit as in claim 9 characterized in that suitable programming of the control programmable means enables a terminal connected to any particular one of the second lines downstream of the corresponding buffer to switch dynamically between functioning as a circuit output terminal for providing output data from the circuit and as a circuit input terminal by way of the feedback means for receiving input data to the circuit.

11. A circuit as in claim 10 characterized in that the means for selectively inverting comprises: a plurality of exclusive OR gates corresponding on a one-to-one basis to at least part of the logic OR/NOR gates, each exclusive OR gate having an output element coupled to the corresponding second line, a first input element coupled to the output section of the corresponding logic OR/NOR gate, and a second input element; and programmable means for selectively coupling each second input element to a logical zero source.

12. A circuit as in claim 11 characterized by means for selectively feeding data complementary to that supplied from the logic and control AND/NAND gates back into them.

13. A circuit as in claim 12 characterized in that the means for selectively feeding comprises: at least one NOR gate, each having an output section coupled to a different one of the first lines exclusive of the input and feedback lines and having a plurality of input sections each coupled to a different one of the output sections of the logic AND/NAND gates; and logic programmable means for selectively connecting each input section of each NOR gate to its output section.

14. A circuit as in claim 9 characterized in that at least one of the buffers is an inverter.

15. A programmable logic circuit characterized as comprising:

a plurality of first lines, one part of which comprises input lines for receiving input data to the circuit and another part of which comprises feedback lines;

a plurality of logic AND/NAND gates, each having an output section and having a plurality of input sections each connected to a different one of the first lines;

a plurality of primary logic OR/NOR gates, each having an output section and having a plurality of input sections each coupled to a different one of the output sections of the AND/NAND gates;

a plurality of primary second lines corresponding on a one-to-one basis to the primary OR/NOR gates for transmitting output data from their output sections;

means for selectively inhibiting the transmission of output data on the primary second lines;

feedback means for supplying output data from the primary second lines to the feedback lines;

a plurality of pairs of further logic OR/NOR gates, each having an output section and having a plurality of input sections each coupled to a different one of the output sections of the AND/NAND gates;

logic programmable means for selectively connecting each input section of each logic gate to its output section;

a plurality of JK flip-flops corresponding on a one-to-one basis to the pairs of further OR/NOR gates, each flip-flop having a J data input terminal and a K data input terminal coupled respectively to the output sections of the corresponding pair, a clock input terminal for receiving a clock signal, and a data outout terminal; and a plurality of further second lines corresponding on a one-to-one basis to the flip-flops and respectively coupled to their output terminals for transmitting output data therefrom.

16. A programmable logic circuit having: a plurality of first lines at least partly being input lines for receiving input data to the circuit and at least partly being feedback lines; a plurality of logic AND/NAND gates, each having an output section and a plurality of input sections each connected to a different one of the first lines; a plurality of primary logic OR/NOR gates, each having an output section and a plurality of input sections each coupled to a different one of the output sections of the AND/NAND gates; a plurality of primary second lines corresponding respectively to the primary OR/-

NOR gates for transmitting output data from their output sections; means for selectively inhibiting the transmission of output data on the primary second lines; feedback means for supplying output data from the primary second lines to the feedback lines; a plurality of pairs of further logic OR/NOR gates, each having an output section and having a plurality of input sections each coupled to a different one of the output sections of the AND/NAND gates; logic programmable means for selectively separating each input section of each logic gate from its output section; a plurality of flip-flops corresponding respectively to the pairs of further OR/NOR gates for receiving data from their output sections; and a plurality of further second lines corresponding respectively to the flip-flops for transmitting output data from them; characterized in that:

each flip-flop is a JK flip-flop having a J data input terminal and a K data input terminal coupled respectively to the output sections of the corresponding pair of further OR/NOR gates, a clock input terminal for receiving a clock signal, and a data output terminal.

17. A circuit as in claim 15 or 16 characterized by means for selectively enabling at least part of the flip-flops to function as D flip-flops for selected time periods.

18. A circuit as in claim 17 wherein each further second line is coupled to a corresponding circuit terminal, characterized by means for selectively transmitting input data received at at least part of the circuit terminals to the data input terminals of the corresponding flip-flops.

19. A circuit as in claim 18 characterized in that the means for selectively transmitting is employable in a feedback mode for supplying output data from the further second lines to said corresponding flip-flops through their data input terminals.

20. A circuit as in claim 18 characterized by means for selectively inhibiting transmission of output data on the further second lines.

21. A circuit as in claim 20 characterized by feedback means for supplying output data from at least part of the flip-flops to selected ones of the first lines exclusive of the input and feedback lines.

22. A circuit as in claim 21 characterized by means for selectively placing each of at least part of the flip-flops in either of a pair of opposite logic states irrespective of the clock signal.

23. A programmable logic circuit characterized as comprising:
a plurality of first lines, one part of which comprises input lines for receiving input data to the circuit;
a plurality of logic AND/NAND gates, each having an output section and having a plurality of input sections each connected to a different one of the first lines;
a plurality of pairs of logic OR/NOR gates, each having an output section and having a plurality of input sections each coupled to a different one of the output sections of the logic AND/NAND gates;
logic programmable means for selectively connecting each logic input section of each logic gate to its logic output section;
a plurality of JK flip-flops corresponding on a one-to-one basis to the pairs of logic OR/NOR gates, each flip-flop having a J data input terminal and a K data input terminal coupled respectively to the output sections of the corresponding pair, a clock input terminal for receiving a clock signal, and a data output terminal; and
a plurality of second lines corresponding on a one-to-one basis to the flip-flops and respectively coupled to their output terminals for transmitting output data supplied therefrom.

24. A programmable logic circuit having: a plurality of first lines, at least part of which are input lines for receiving input data to the circuit; a plurality of logic AND/NAND gates, each having an output section and a plurality of input sections each connected to a different one of the first lines; a plurality of pairs of logic OR/NOR gates, each having an output section and a plurality of input sections each coupled to a different one of the output sections of the AND/NAND gates; logic programmable means for selectively separating each input section of each logic gate from its output section; a plurality of bistable data storage devices corresponding on a one-to-one basis to the pairs of logic OR/NOR gates, each device having a pair of data input terminals coupled respectively to the output sections of the corresponding pair, a clock input terminal for receiving a clock signal, and a data output terminal; and a plurality of second lines, each coupled to a corresponding one of the output terminals for transmitting output data supplied therefrom; characterized in that each device comprises a JK flip-flop, the data input terminals for each device thereby being a J terminal and a K terminal.

25. A circuit as in claim 23 or 24 characterized by means for selectively enabling at least a given part of the flip-flops to function as D flip-flops for selected time periods.

26. A circuit as in claim 25 characterized in that the means for selectively enabling comprises: a plurality of inverters corresponding on a one-to-one basis to at least the given part of the flip-flops, each inverter having an input element coupled to one of the input terminals of the corresponding flip-flop, an output element coupled to the other input terminal of the corresponding flip-flop for providing data complementary to that received at the input element, and an inverter control line for receiving control data to control activation of that inverter.

27. A circuit as in claim 26 characterized in that the means for selectively enabling further includes: at least one control AND/NAND gate, each having an output section coupled to at least one of the inverter control lines and having a plurality of input sections each connected to a different one of the first lines; and control programmable means for selectively connecting each input section of each control gate to its output section.

28. A circuit as in claim 27 further characterized by programmable means for selectively permanently electrically separating each inverter control line from the output section of the associated control gate, the inverter for any particular one of the inverter control lines so separated going to an inactive state whereby the flip-flop for the particular corresponding inverter functions unconditionally as a JK flip-flop.

29. A circuit as in claim 23 or 24 characterized by means for selectively forcing each of at least a given part of the flip-flops to either of pair of opposite logic states irrespective of the clock signal.

30. A circuit as in claim 29 characterized in that the means for selectively forcing comprises a plurality of asynchronous control sections corresponding on a one-to-one basis to at least the given part of the flip-flops and incorporated respectively in them, each having a pair of control terminals for receiving control data to place that flip-flop in one or the other of the logic states.

31. A circuit as in claim 30 characterized in that the means for selectively forcing further includes: a plurality of control AND/NAND gates, each having an output section coupled to at least one of the control terminals but not coupled to both control terminals of any of the flip-flops and having a plurality of input sections each coupled to a different one of the first lines; and control programmable means for selectively connecting each input section of each control gate to its output section.

32. A circuit as in claim 30 characterized in that the means for selectively forcing further includes: a plurality of control OR/NOR gates, each having an output section coupled to at least one of the control terminals but not coupled to both control terminals of any of the flip-flops and having a plurality of input sections each coupled to a different one of the output sections of the logic AND/NAND gates; and control programmable means for selectively connecting each input section of each control gate to its output section.

33. A circuit as in claim 25 or 24 wherein each second line is coupled to a corresponding circuit terminal, characterized by means for selectively transmitting input data received at at least a given part of the circuit terminals to the data input terminals of the corresponding flip-flops.

34. A circuit as in claim 33 characterized in that the means for selectively transmitting comprises a plurality of input/feedback gates corresponding on a one-to-one basis to at least the given part of the circuit terminals, each input/feedback gate having an input element coupled to the corresponding second line, a pair of output elements coupled respectively to the data input terminals of the corresponding flip-flop and an input/feedback control line for receiving control data to control activation of that input/feedback gate.

35. A circuit as in claim 34 characterized in that the means for selectively transmitting further comprises: at least one control AND/NAND gate, each having an output section coupled to at least one of the input feedback control lines and having a plurality of input sections each connected to a different one of the first lines; and control programmable means for selectively connecting each input section of each control gate to its output section.

36. A circuit as in claim 35 characterized in that the data provided at one of the output elements of each input/feedback gate is of opposite polarity to the data provided at the other output element.

37. A circuit as in claim 35 characterized in that the means for selectively transmitting is employable in a feedback mode for supplying output data from the second lines to said corresponding flip-flops through their data input terminals.

38. A circuit as in claim 34 characterized by means for selectively inhibiting transmission of output data on the second lines.

39. A circuit as in claim 38 characterized in that the means for selectively inhibiting comprises a plurality of buffers corresponding on a one-to-one basis to at least the given part of the circuit terminals and respectively coupled between the output terminals of said corresponding flip-flops and the corresponding input/feedback gates along the corresponding second lines, each buffer having a buffer control line for receiving control data to control activation of that buffer.

40. A circuit as in claim 39 characterized in that at least one of the buffers is an inverter.

41. A circuit as in claim 39 characterized in that the means for selectively inhibiting further includes: a logical zero source; an enable/disable line for transmitting enable/disable data for the buffers; and programmable means for selectively coupling each buffer control line to the logical zero source and the enable/disable line.

42. A circuit as in claim 41 characterized in that a particular one of the circuit terminals coupled to one of the second lines having one of the buffers serves unconditionally to provide output data from the circuit when the buffer control line for that buffer is so coupled to the logical zero source.

43. A circuit as in claim 42 characterized in that the particular circuit terminal is dynamically switchable between providing output data from the circuit and receiving input data by way of the input/feedback gate to the corresponding flip-flop when the buffer control line for that buffer is so coupled to the enable/disable line and is not so coupled to the logical zero source.

44. A circuit as in claim 43 characterized in that the particular circuit terminal serves unconditionally to receive input data by way of the input/feedback gate means to the corresponding flip-flop when the buffer control line for that buffer is not so coupled to the logical zero source and to the enable/disable line.

45. A circuit as in claim 41 characterized by feedback means for supplying output data from at least part of the flip-flops to selected ones of the first lines exclusive of the input lines.

46. A circuit as in claim 1, 2, 7, 8, 15, 16, 23, or 24 characterized in that fusible links are contained in the programmable means so as to enable the circuit to be field programmable.

* * * * *

UNITED STATES PATENT AND TRADEMARK OFFICE
CERTIFICATE OF CORRECTION

PATENT NO. : 4,422,072
DATED : December 20, 1983
INVENTOR(S) : NAPOLEONE CAVLAN

It is certified that error appears in the above-identified patent and that said Letters Patent is hereby corrected as shown below:

Column 5, line 34, "sections" should read -- section --.

Column 7, line 8, "section" should read -- second --.

IN THE CLAIMS

Claim 7, line 12, "sedction" should read -- section --.

Claim 23, line 14, delete "logic" at the first occurrence;
line 15, delete "logic".

Claim 33, line 1, "25" should read -- 23 --.

Claim 35, lines 4 and 5, "input feedback" should read
-- input/feedback --.

Claim 44, line 4, delete "means".

Signed and Sealed this

Fifth Day of June 1984

[SEAL]

Attest:

GERALD J. MOSSINGHOFF

Attesting Officer

Commissioner of Patents and Trademarks